(12) United States Patent
Watanabe et al.

(10) Patent No.: US 7,868,395 B2
(45) Date of Patent: Jan. 11, 2011

(54) METAL INSULATOR SEMICONDUCTOR FIELD EFFECT TRANSISTOR HAVING FIN STRUCTURE

(75) Inventors: Takeshi Watanabe, Yokohama (JP); Kimitoshi Okano, Yokohama (JP); Takashi Izumida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 831 days.

(21) Appl. No.: 11/495,885

(22) Filed: Jul. 31, 2006

(65) Prior Publication Data
US 2007/0063224 A1 Mar. 22, 2007

(30) Foreign Application Priority Data
Sep. 16, 2005 (JP) ............... 2005-270772

(51) Int. Cl.
*H01L 27/088* (2006.01)
(52) U.S. Cl. ............... 257/401; 257/368; 257/374; 257/288; 257/E21.014; 438/197; 438/201; 438/257
(58) Field of Classification Search ............ 257/274, 257/328, 347, 401, E21.014, E21.209, E21.438, 257/E21.442, E21.703, E29.129, E29.13, 257/E29.137, E29.302, 374; 438/196, 197, 438/201, 218, 257, 261, 264, 593
See application file for complete search history.

(56) References Cited

U.S. PATENT DOCUMENTS 6,977,837 B2  12/2005 Watanabe et al.
2006/0029887 A1* 2/2006 Oh et al. ............... 430/311

OTHER PUBLICATIONS

U.S. Appl. No. 11/203,425, filed Aug. 15, 2005, Izumida et al.
M. Kondo et al., "A FinFET Design Based on Three-Dimensional Process and Device Simulations", IEEE 2003, pp. 179-182.
J. Kedzierski et al, "Metal-gate FinFET and fully-depleted SOI devices using total gate silicidation", IEDM 2002, Tech Digest, pp. 247-250, Dec. 2002.

* cited by examiner

*Primary Examiner*—Cuong Q Nguyen
*Assistant Examiner*—Meiya Li
(74) *Attorney, Agent, or Firm*—Foley & Lardner LLP

(57) ABSTRACT

A semiconductor device includes a fin-shaped semiconductor layer, a gate electrode section formed in a widthwise direction of the semiconductor layer with a gate insulation film interposed therebetween, the gate electrode section including a plurality of electrode materials having different work functions and stacked one another, and a channel section formed adjacent to the gate insulation film in the semiconductor layer. The semiconductor device further includes source and drain regions formed adjacent to the channel section.

21 Claims, 25 Drawing Sheets

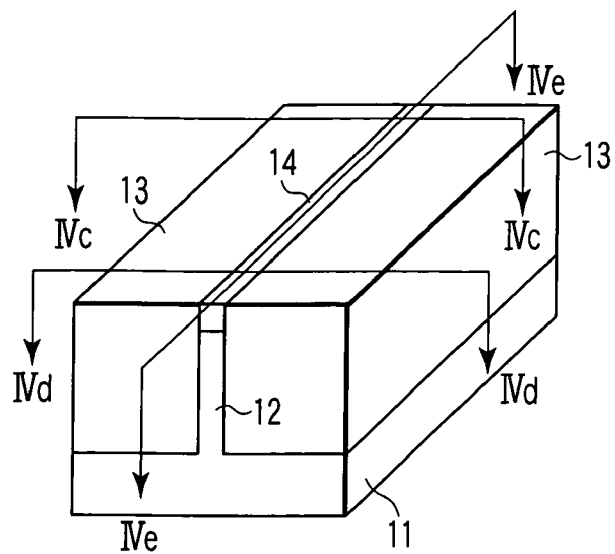
F I G. 4A
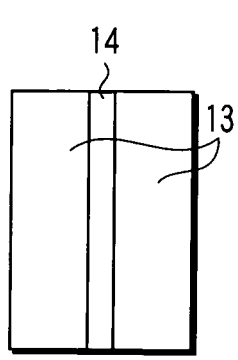
F I G. 4B
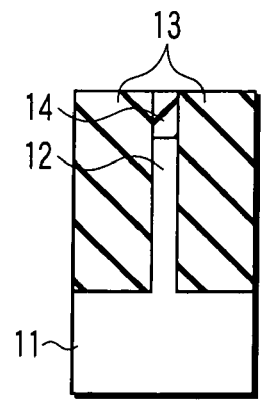
F I G. 4C
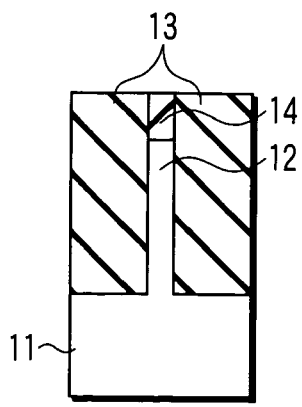
F I G. 4D
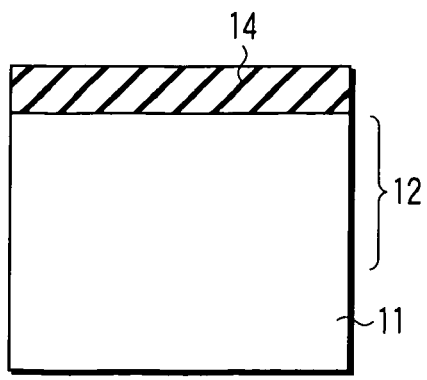
F I G. 4E

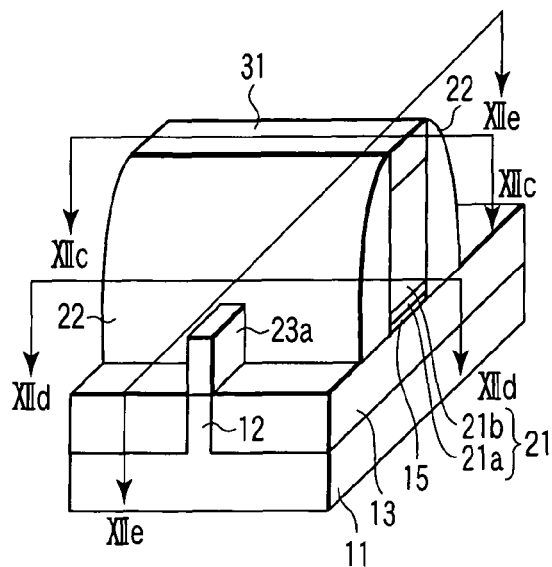
F I G. 12A
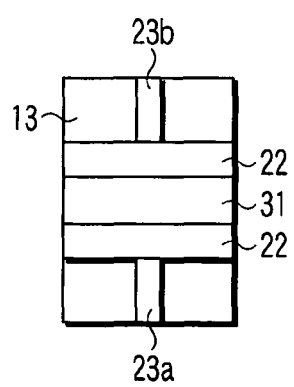
F I G. 12B
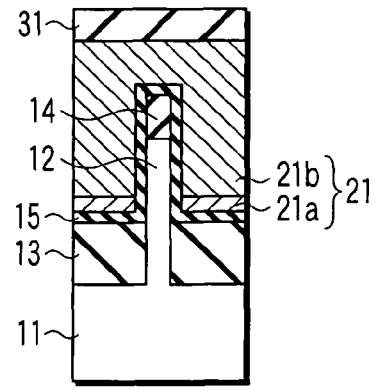
F I G. 12C
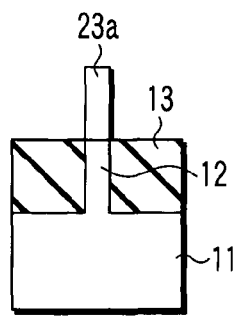
F I G. 12D
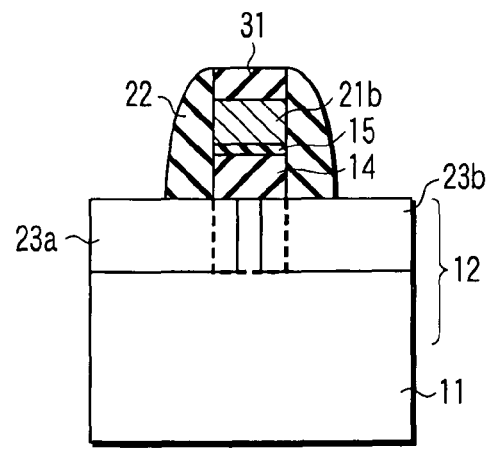
F I G. 12E

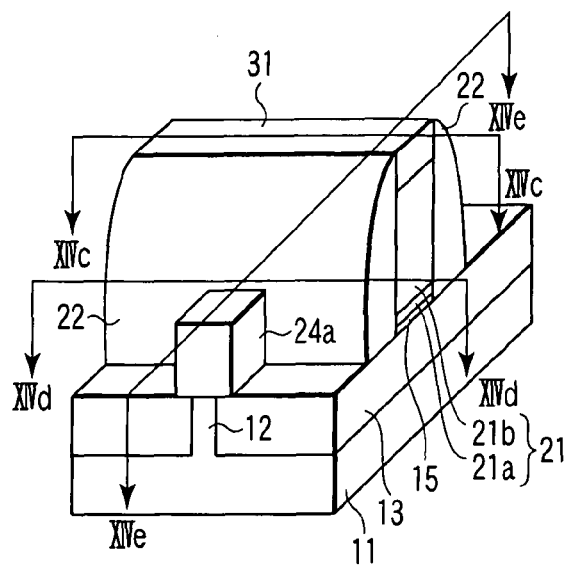
F I G. 14A
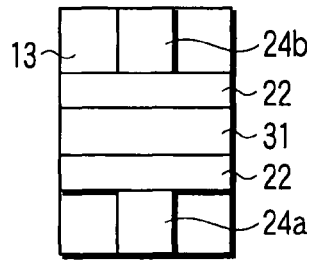
F I G. 14B
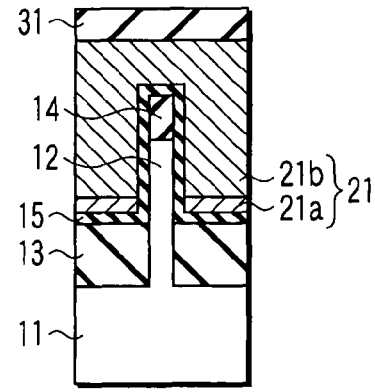
F I G. 14C
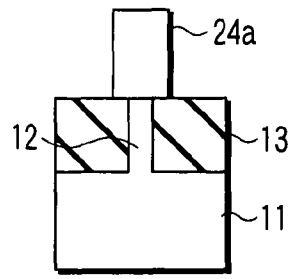
F I G. 14D
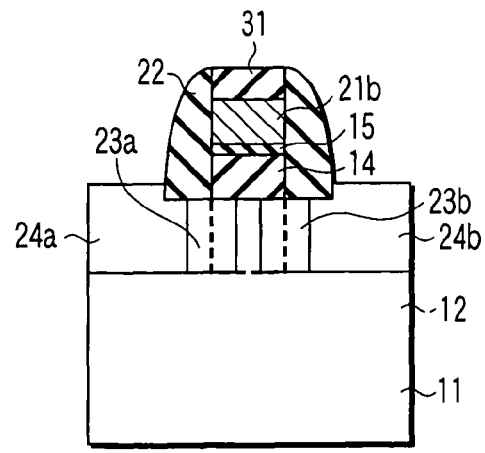
F I G. 14E

| Work function | Metal materials |
|---|---|
| 4.2eV | TaTi, Ti |
| 4.3eV | Ta, $Ta_2N$, TaSiN, WSi, TiB, $HfSi_2$ |
| 4.4eV | TaB, HfB, TiAlN, HfAlN, NiSiAs |
| 4.5eV | TaN, NiSi, Ta, $NiSi_2$, CoSi |
| 4.6eV | PdSi, $CoSi_2$, TiN, W, NiSi, WSi |
| 4.7eV | HfN, NiSi, Mo, TiN |
| 4.8eV | TiN, NiSiB |
| 4.9eV | TaAlN, NiSiB, PtWSi, Au |
| 5.0eV | TaN, Ru, TiAlN |

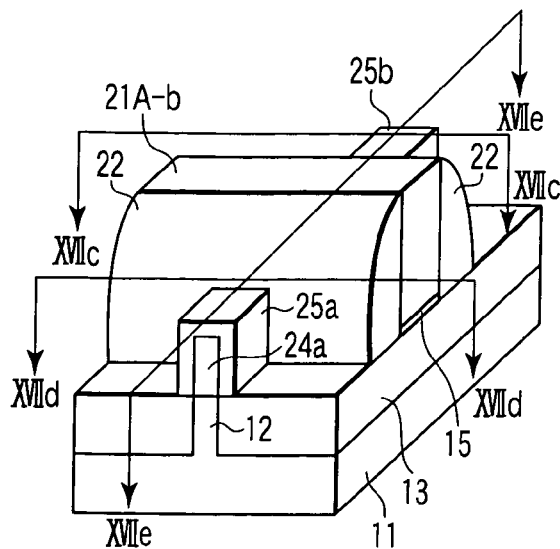
F I G. 17A
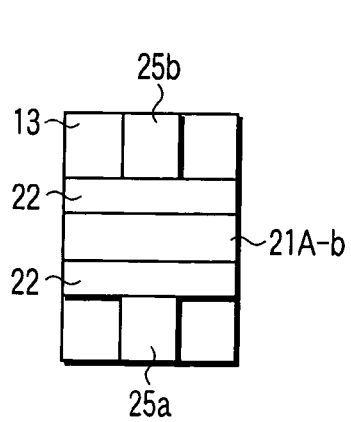
F I G. 17B
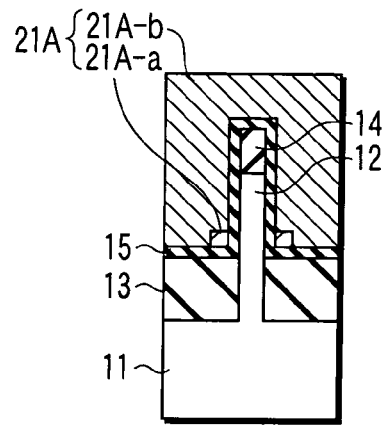
F I G. 17C
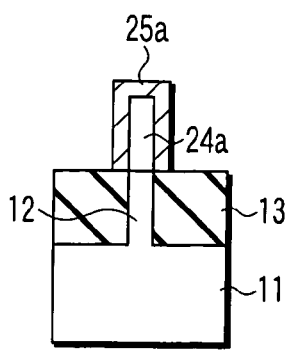
F I G. 17D
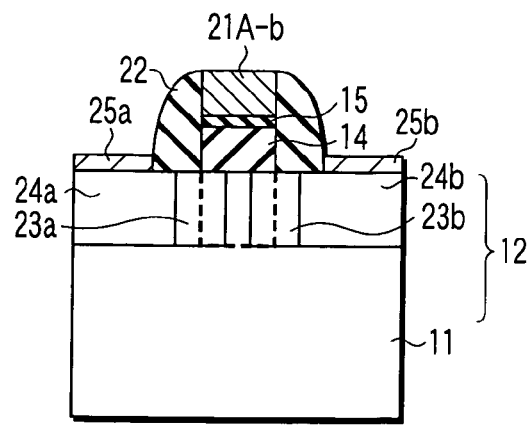
F I G. 17E

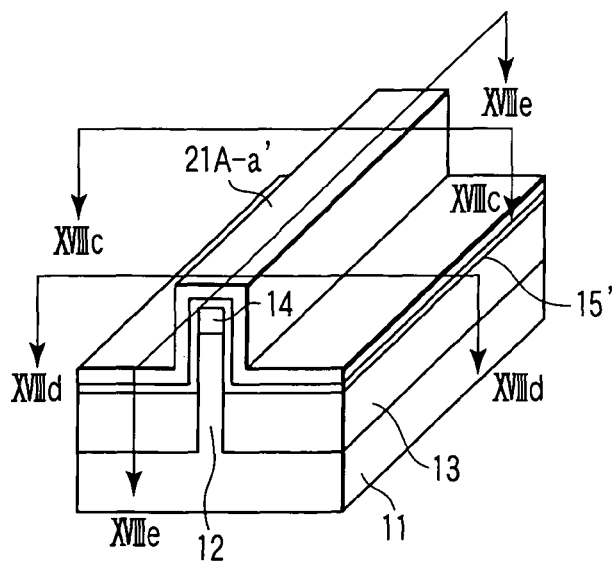
F I G. 18A
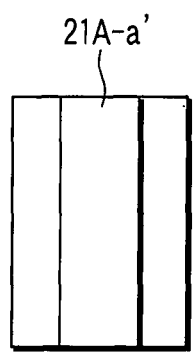
F I G. 18B
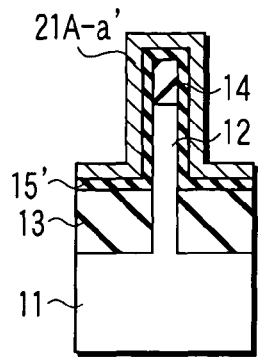
F I G. 18C
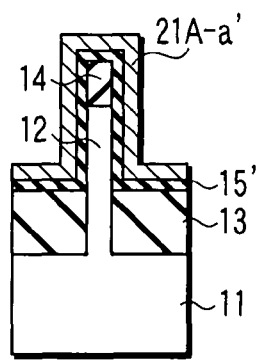
F I G. 18D
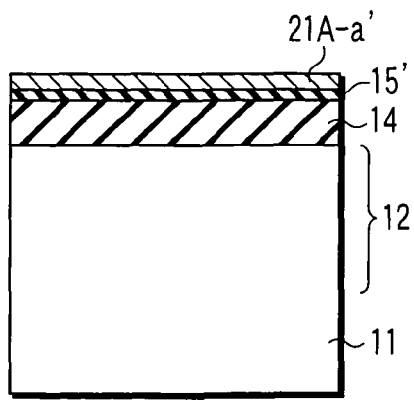
F I G. 18E

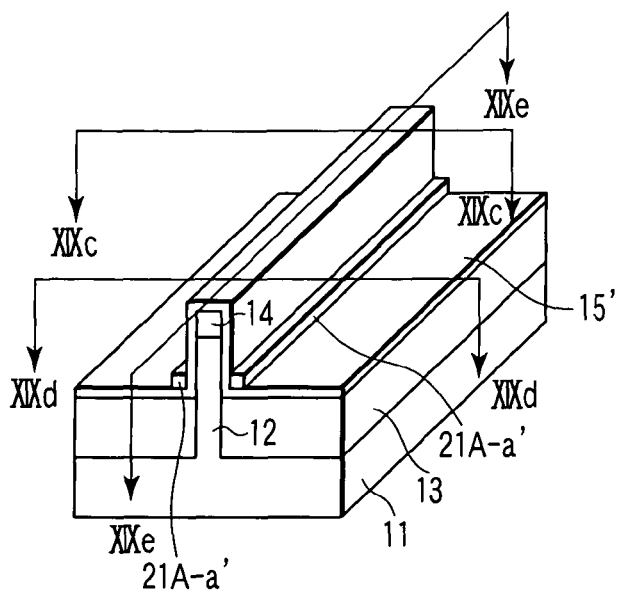
F I G. 19A
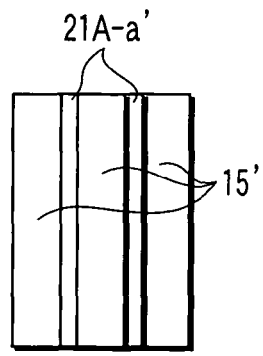
F I G. 19B
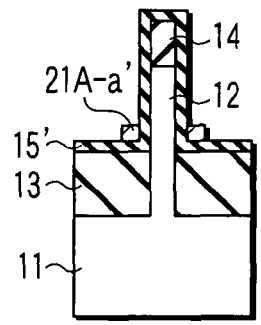
F I G. 19C
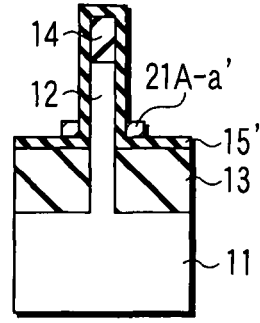
F I G. 19D
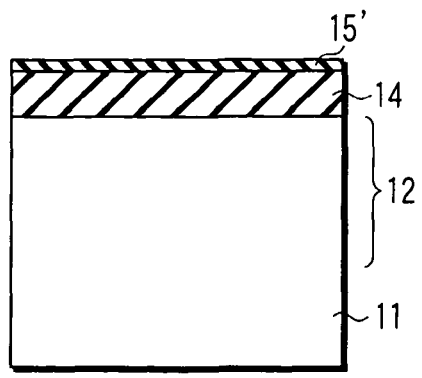
F I G. 19E

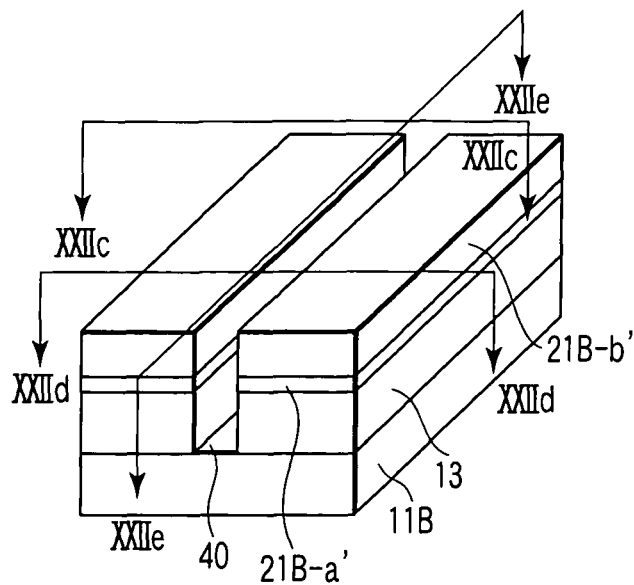
F I G. 22A
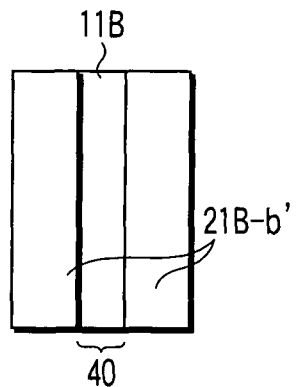
F I G. 22B
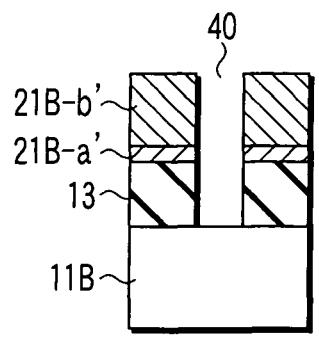
F I G. 22C
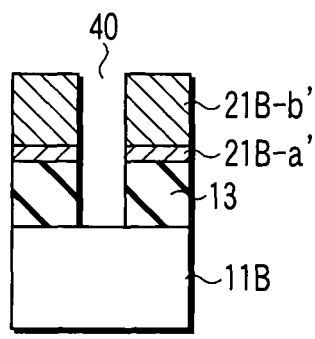
F I G. 22D
F I G. 22E

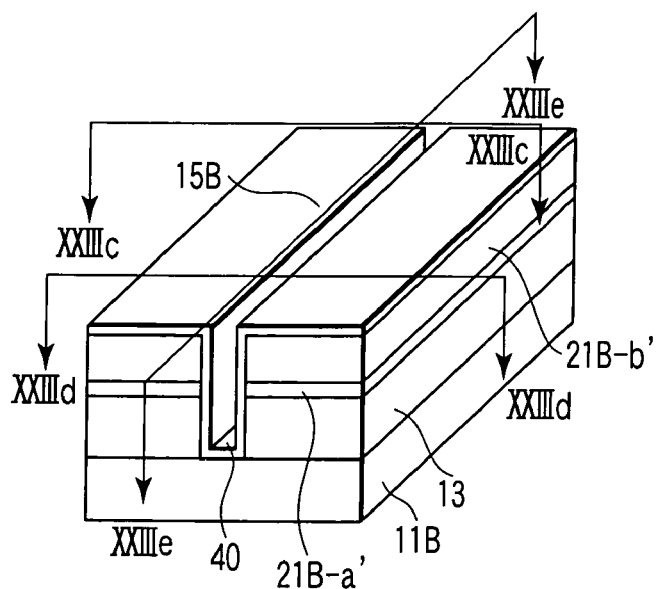
F I G. 23A
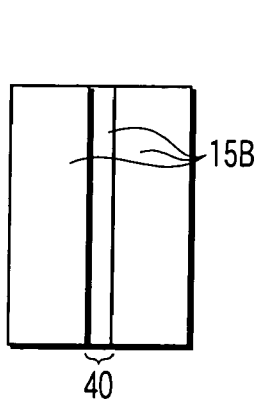
F I G. 23B
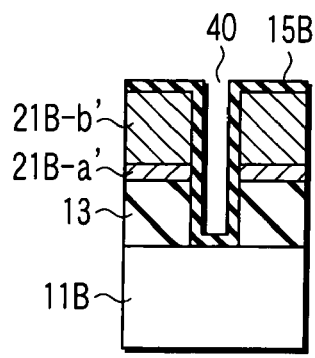
F I G. 23C
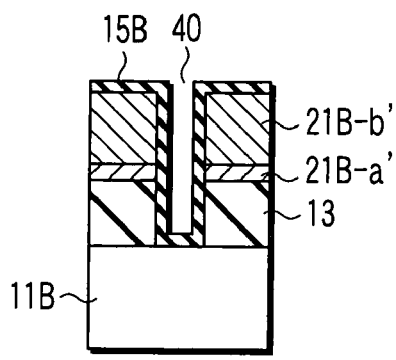
F I G. 23D
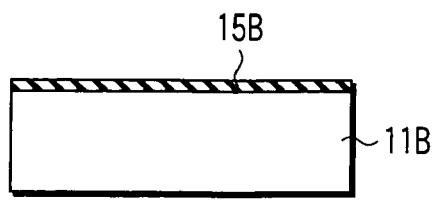
F I G. 23E

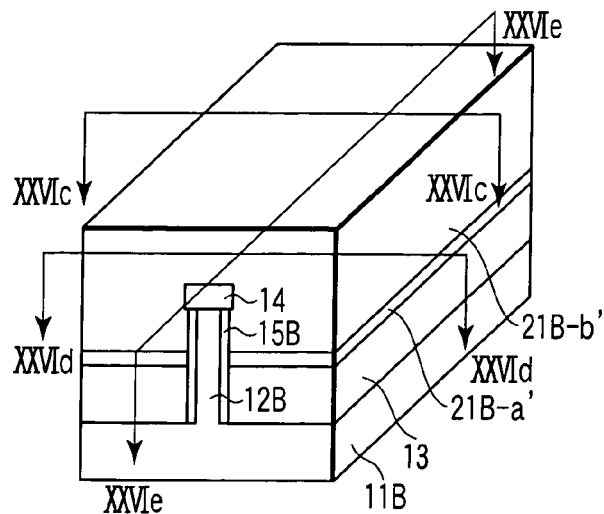
F I G. 26A
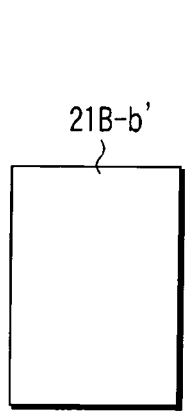
F I G. 26B
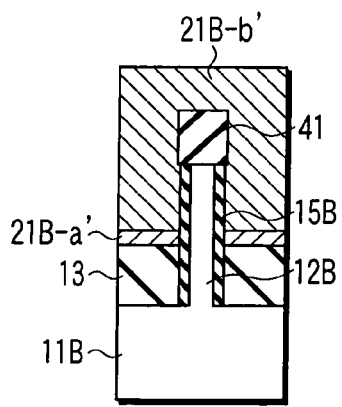
F I G. 26C
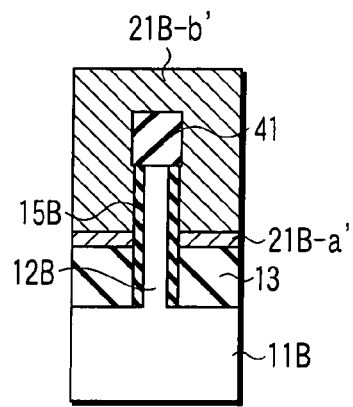
F I G. 26D
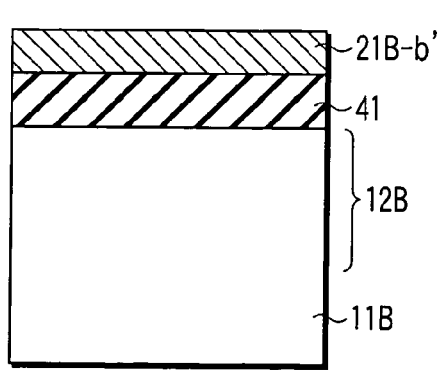
F I G. 26E
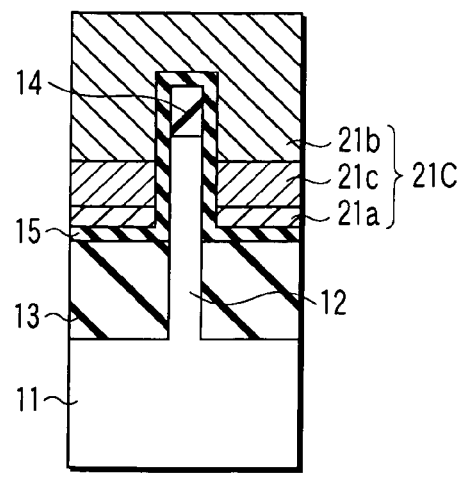
F I G. 27

METAL INSULATOR SEMICONDUCTOR FIELD EFFECT TRANSISTOR HAVING FIN STRUCTURE

CROSS-REFERENCE TO RELATED APPLICATIONS

This application is based upon and claims the benefit of priority from prior Japanese Patent Application No. 2005-270772, filed Sep. 16, 2005, the entire contents of which are incorporated herein by reference.

BACKGROUND OF THE INVENTION

1. Field of the Invention

The present invention relates to a semiconductor device. More specifically, the invention relates to a metal insulator semiconductor field effect transistor (MISFET) having a fin-type structure.

2. Description of the Related Art

A prior art fin-type MISFET (abbreviated as Fin-FET hereinafter) has a structure in which the source/drain easily causes a punch-through phenomenon on the bottom of a fin corresponding to the edge (bottom) of a gate electrode. The Fin-FET therefore has the problem that off-leak currents are high (or short-channel effects are easy to produce). See, for example, Masaki Kondo et al., "A FinFET Design Based on Three-Dimensional Process and Device Simulations," Toshiba Corporation, IEEE, 2003).

A method of increasing the concentration of impurities of a channel under the fin is proposed in order to resolve the above problem. In other words, a punch-through stopper layer needs to be formed by ion implantation in order to suppress off-leak currents. However, the punch-through stopper layer increases the impurity concentration of the channel. The increase in impurity concentration is likely to degrade the performance of the Fin-FET, e.g., to lower the mobility of electrons, to increase a source-to-drain junction leak (capacitance), and to vary in threshold value.

As described above, the Fin-FET is required to reduce off-leak currents without increasing the concentration of impurities of a channel under a fin.

BRIEF SUMMARY OF THE INVENTION

According to a first aspect of the present invention, there is provided a semiconductor device comprising a fin-shaped semiconductor layer, a gate electrode section formed in a widthwise direction of the semiconductor layer with a gate insulation film interposed therebetween, the gate electrode section including a plurality of electrode materials having different work functions and stacked one another, a channel section formed adjacent to the gate insulation film in the semiconductor layer, and source and drain regions formed adjacent to the channel section.

According to a second aspect of the present invention, there is provided a semiconductor device comprising a semiconductor layer shaped like a fin, first and second diffusion layers formed on sides of the semiconductor layer, between which a body section is formed, and a gate electrode section which includes a plurality of electrode materials having different work functions stacked one another both of the plurality of electrode materials in the gate electrode section being provided to be adjacent to the body section with an insulation film therebetween.

BRIEF DESCRIPTION OF THE SEVERAL VIEWS OF THE DRAWING

FIGS. 4A to 4E are schematic diagrams illustrating a method of manufacturing the Fin-FET according to the first embodiment of the present invention;

FIGS. 12A to 12E are schematic diagrams illustrating a method of manufacturing the Fin-FET according to the first embodiment of the present invention;

FIGS. 14A to 14E are schematic diagrams illustrating a method of manufacturing the Fin-FET according to the first embodiment of the present invention;

FIGS. 17A to 17E are schematic diagrams showing a configuration of a Fin-FET according to a second embodiment of the present invention;

FIGS. 18A to 18E are schematic diagrams illustrating a method of manufacturing the Fin-FET according to the second embodiment of the present invention;

FIGS. 19A to 19E are schematic diagrams illustrating a method of manufacturing the Fin-FET according to the second embodiment of the present invention;

FIGS. 22A to 22E are schematic diagrams illustrating a method of manufacturing the Fin-FET according to the third embodiment of the present invention;

FIGS. 23A to 23E are schematic diagrams illustrating a method of manufacturing the Fin-FET according to the third embodiment of the present invention;

FIGS. 26A to 26E are schematic diagrams illustrating a method of manufacturing the Fin-FET according to the third embodiment of the present invention; and FIG. 27 is a sectional view showing another configuration of the Fin-FET.

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions.

First Embodiment

Figure 1A:
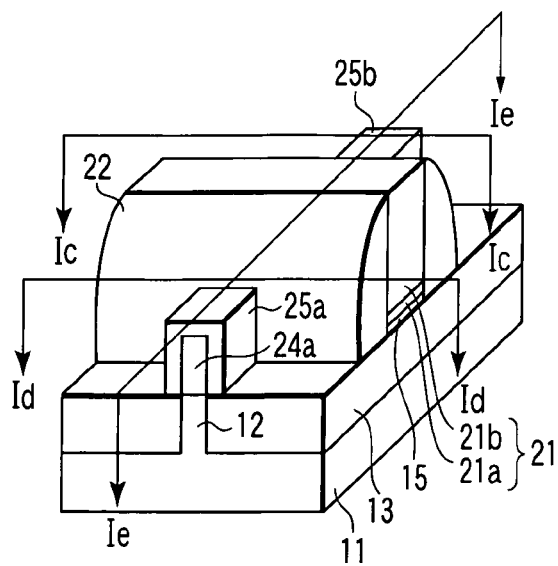
FIGS. 1A to 1E are schematic diagrams showing a configuration of a Fin-FET according to a first embodiment of the present invention.
Figure 1B:
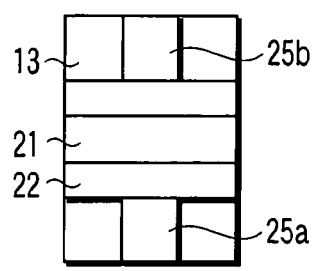
Figure 1C:
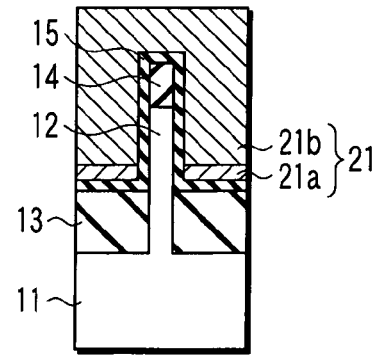
Figure 1D:
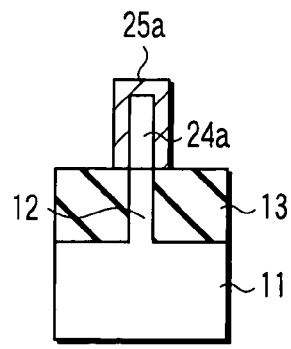
Figure 1E:
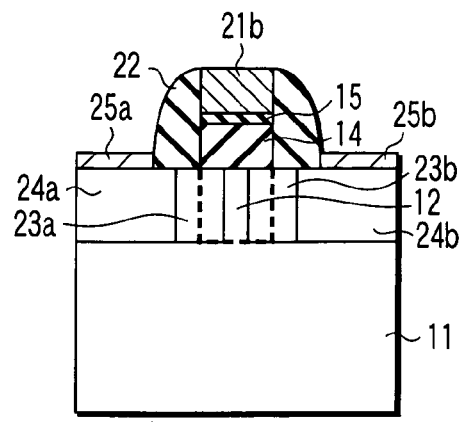
Figure 2A:
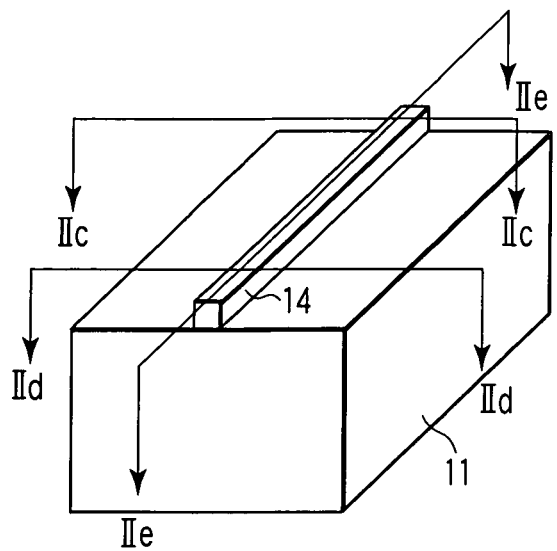
FIGS. 2A to 2E are schematic diagrams illustrating a method of manufacturing the Fin-FET according to the first embodiment of the present invention.
Figure 2B:
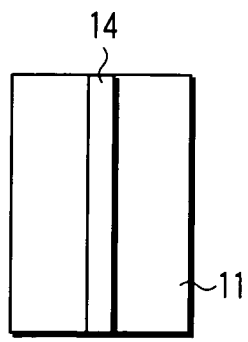
Figure 2C:
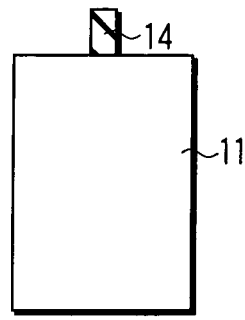
Figure 2D:
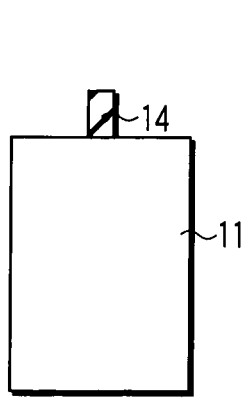
Figure 2E:
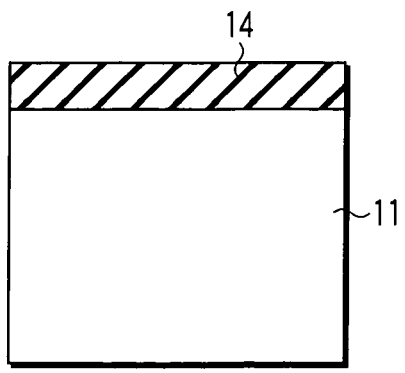
Figure 3A:
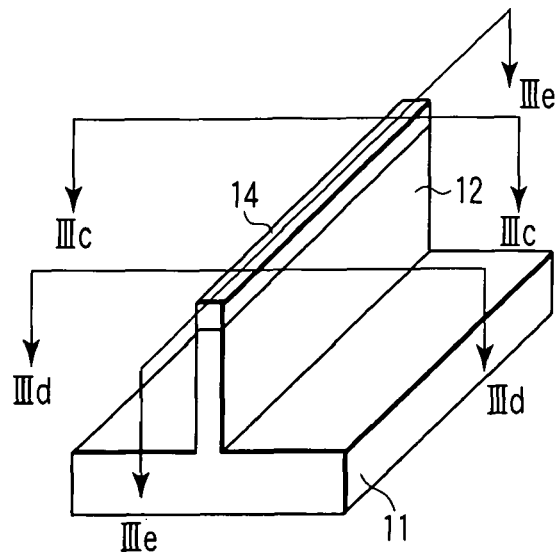
FIGS. 3A to 3E are schematic diagrams illustrating a method of manufacturing the Fin-FET according to the first embodiment of the present invention.
Figure 3B:
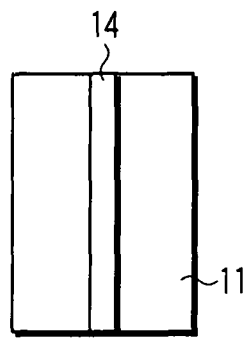
Figure 3C:
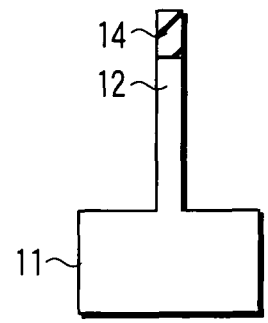
Figure 3D:
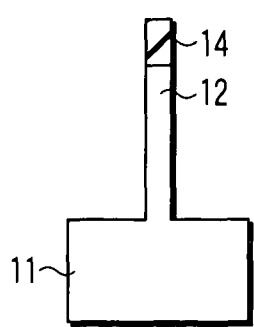
Figure 3E:
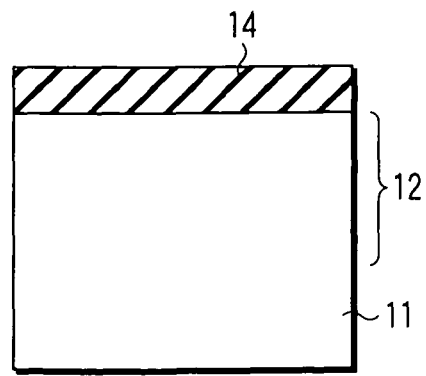
Figure 5A:
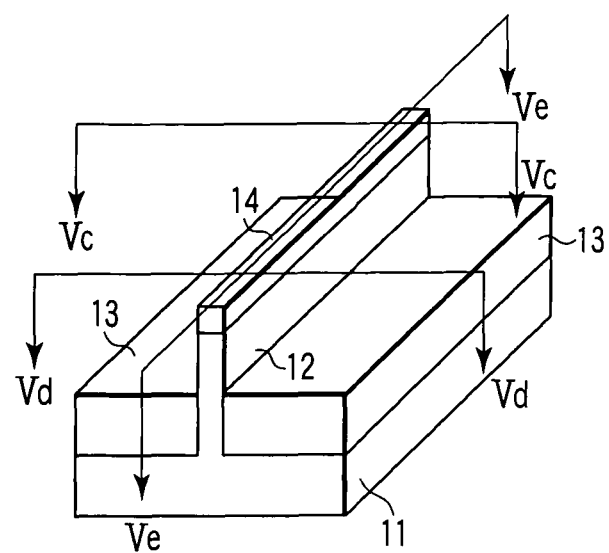
FIGS. 5A to 5E are schematic diagrams illustrating a method of manufacturing the Fin-FET according to the first embodiment of the present invention.
Figure 5B:
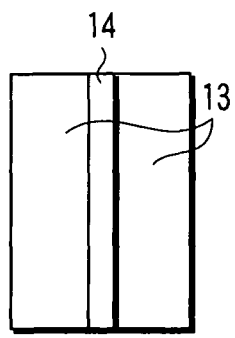
Figure 5C:
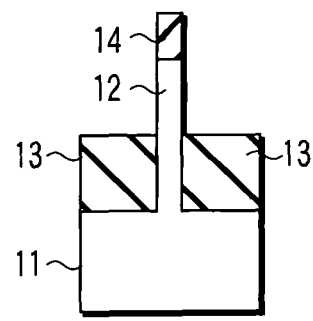
Figure 5D:
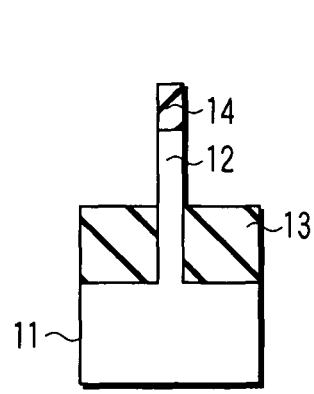
Figure 5E:
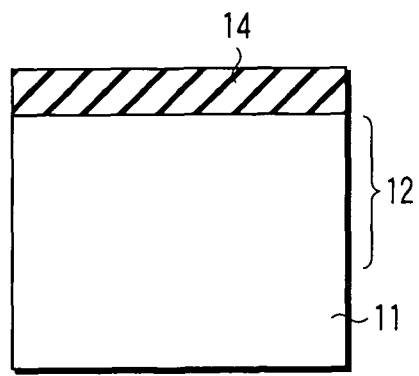
Figure 6A:
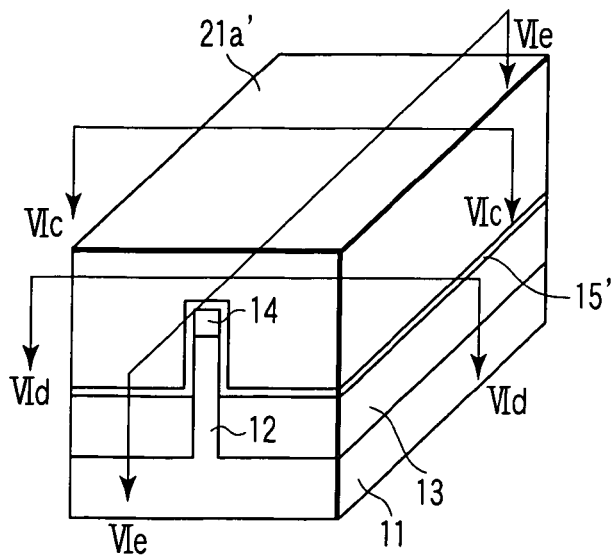
FIGS. 6A to 6E are schematic diagrams illustrating a method of manufacturing the Fin-FET according to the first embodiment of the present invention.
Figure 6B:
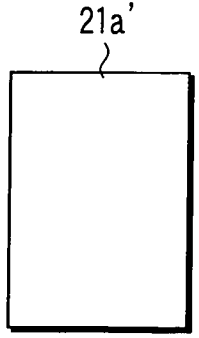
Figure 6C:
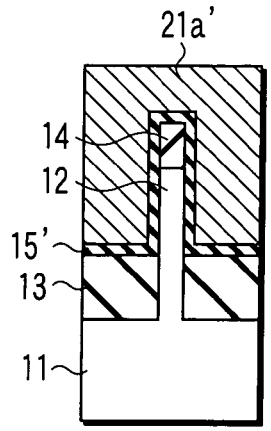
Figure 6D:
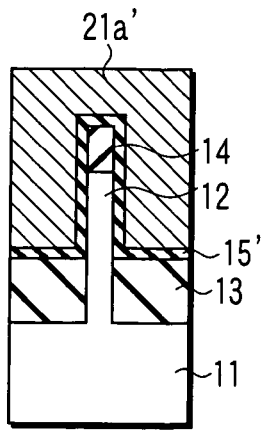
Figure 6E:
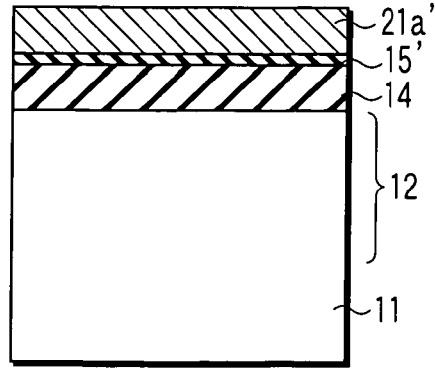
Figure 7A:
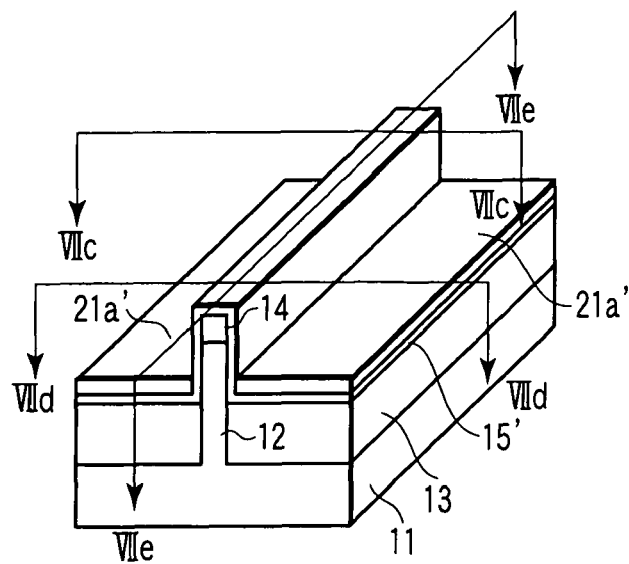
FIGS. 7A to 7E are schematic diagrams illustrating a method of manufacturing the Fin-FET according to the first embodiment of the present invention.
Figure 7B:
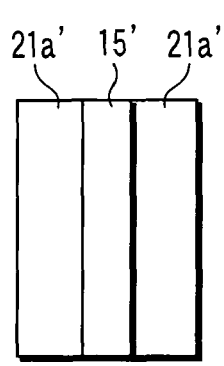
Figure 7C:
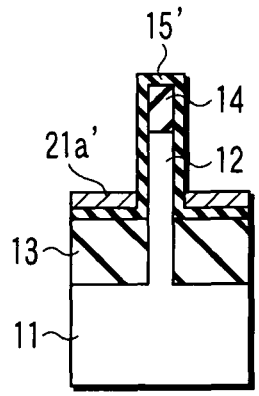
Figure 7D:
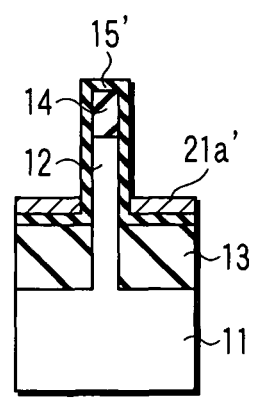
Figure 7E:
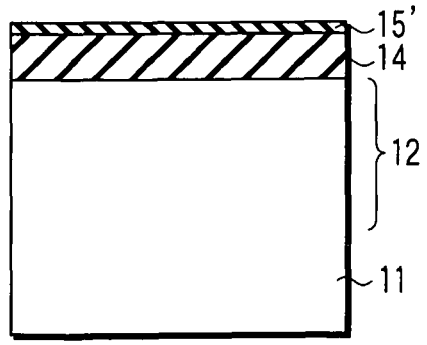
Figure 8A:
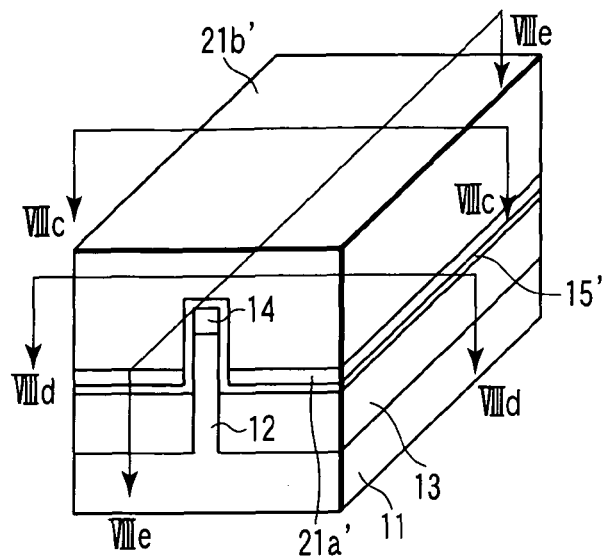
FIGS. 8A to 8E are schematic diagrams illustrating a method of manufacturing the Fin-FET according to the first embodiment of the present invention.
Figure 8B:
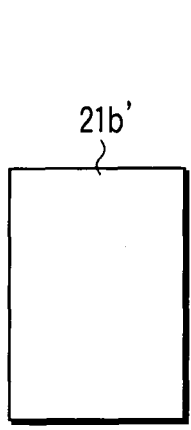
Figure 8C:
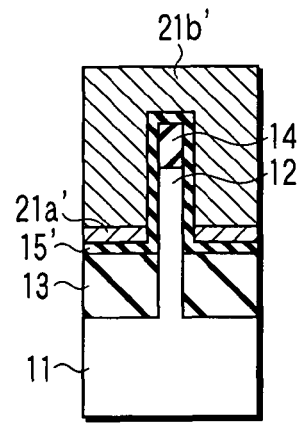
Figure 8D:
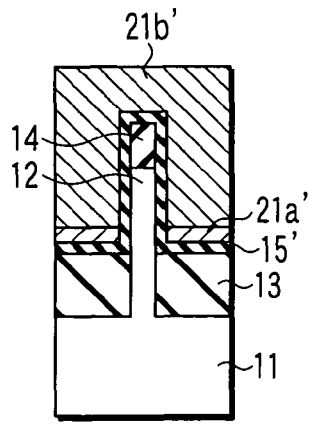
Figure 8E:
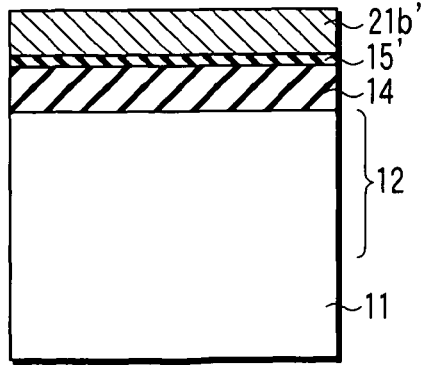
Figure 9A:
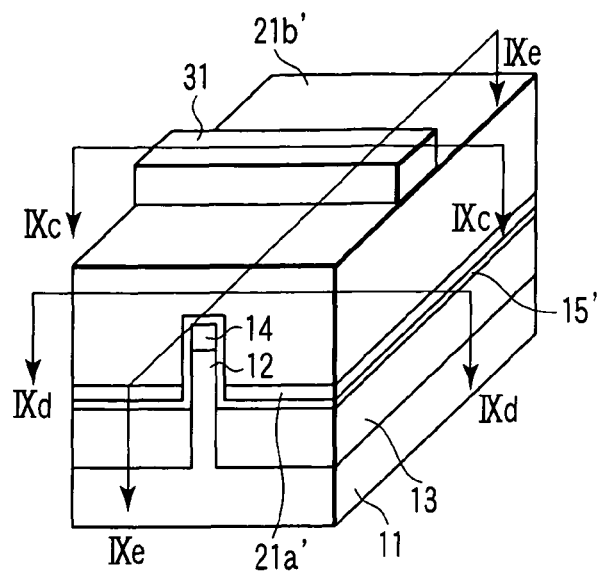
FIGS. 9A to 9E are schematic diagrams illustrating a method of manufacturing the Fin-FET according to the first embodiment of the present invention.
Figure 9B:
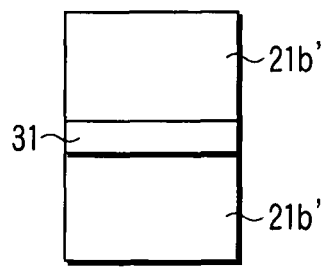
Figure 9C:
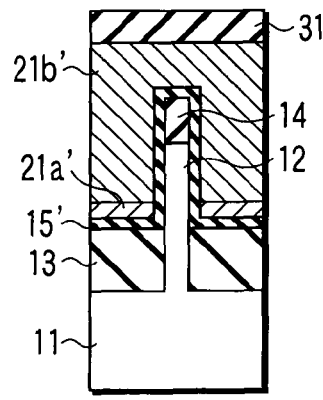
Figure 9D:
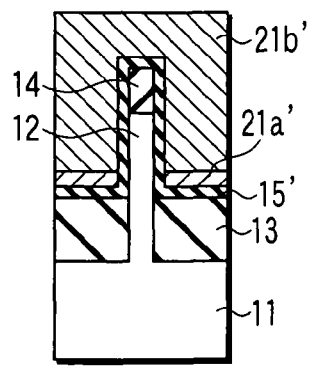
Figure 9E:
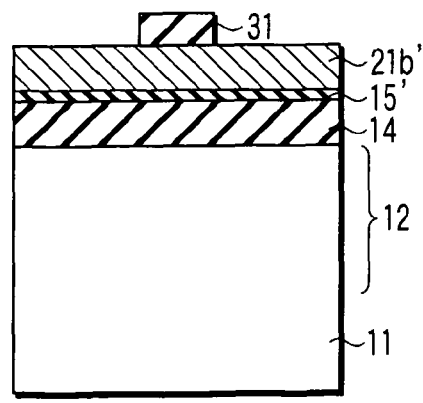
Figure 10A:
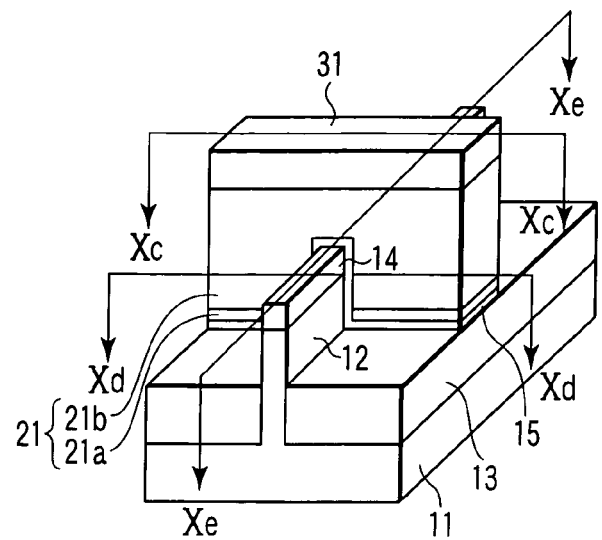
FIGS. 10A to 10E are schematic diagrams illustrating a method of manufacturing the Fin-FET according to the first embodiment of the present invention.
Figure 10B:
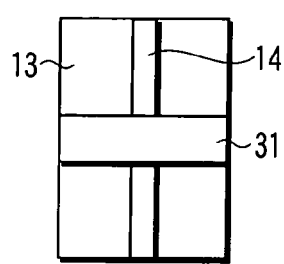
Figure 10C:
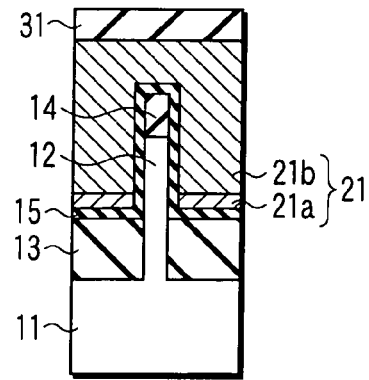
Figure 10D:
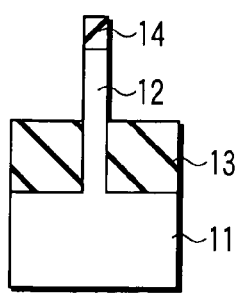
Figure 10E:
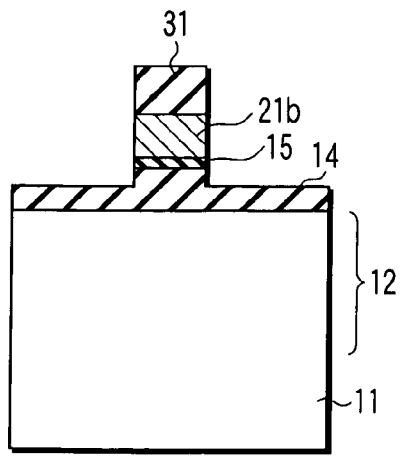
Figure 11A:
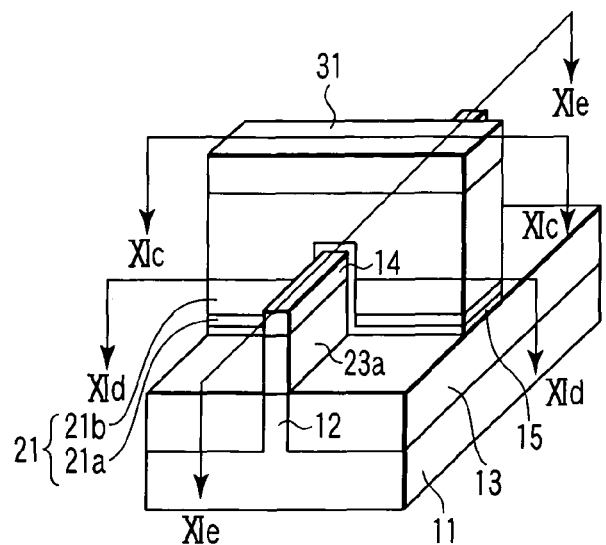
FIGS. 11A to 11E are schematic diagrams illustrating a method of manufacturing the Fin-FET according to the first embodiment of the present invention.
Figure 11B:
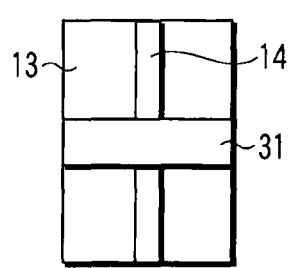
Figure 11C:
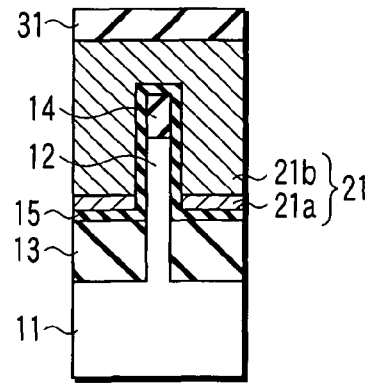
Figure 11D:
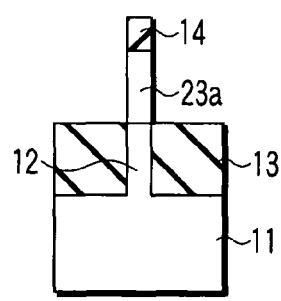
Figure 11E:
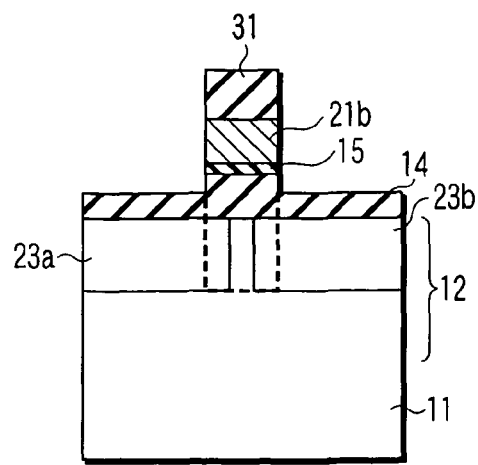
Figure 13A:
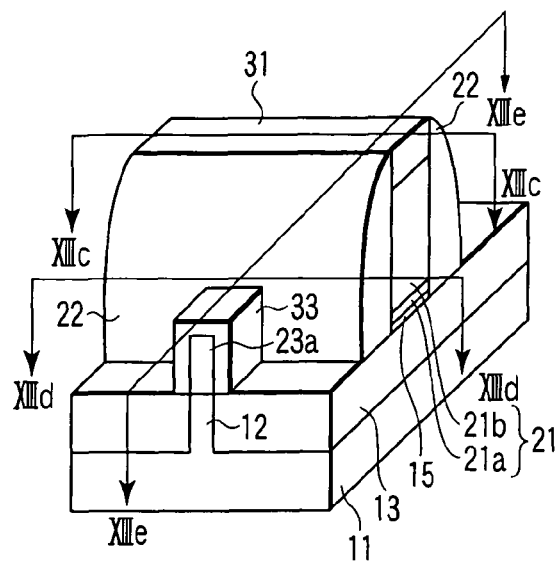
FIGS. 13A to 13E are schematic diagrams illustrating a method of manufacturing the Fin-FET according to the first embodiment of the present invention.
Figure 13B:
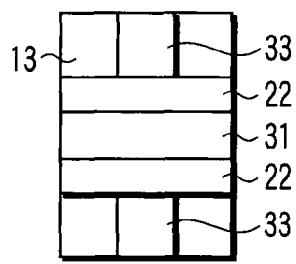
Figure 13C:
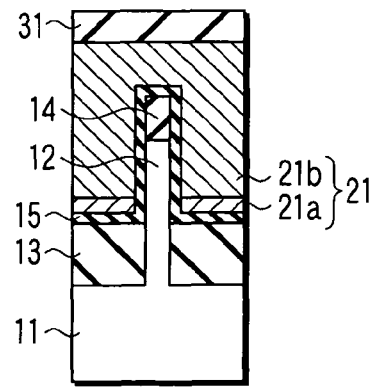
Figure 13D:
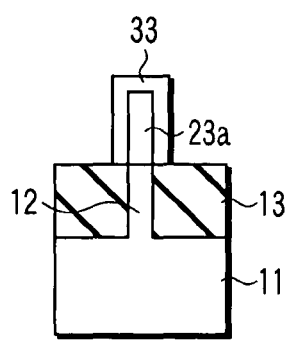
Figure 13E:
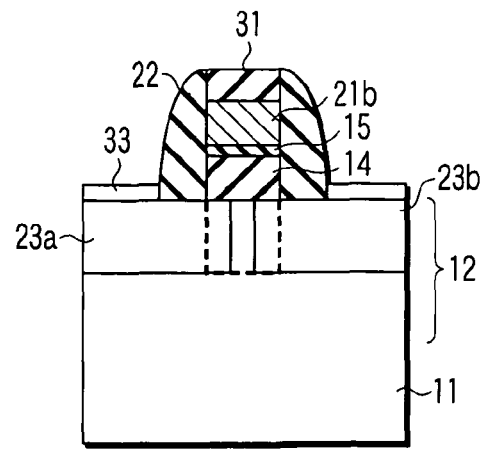

FIGS. 1A to 1E show a basic configuration of a semiconductor device (Fin-FET) according to a first embodiment of the present invention. Of these figures, FIG. 1A is a perspective view thereof, FIG. 1B is a plan view thereof, FIG. 1C is a sectional view taken along line Ic—Ic of FIG. 1A, FIG. 1D is a sectional view taken along line Id—Id of FIG. 1A, and FIG. 1E is a sectional view taken along line Ie—Ie of FIG. 1A. In the first embodiment, a fin is formed by processing part of a substrate into a desired shape, and a gate electrode section is formed of metal.

Referring to FIGS. 1A to 1E, a fin (fin-shaped semiconductor layer) 12, which is made of, e.g., single-crystal silicon, is formed on the surface of a silicon substrate (semiconductor substrate) 11. The fin 12 is provided in almost the middle of the top surface of the substrate 11 and along the lengthwise direction thereof, as shown in FIG. 1A. The fin 12 has a given width, a given height and the same length as that of the silicon substrate 11. An insulation film (e.g., SiO$_2$ film) 13 for element isolation is provided on the surface of the silicon substrate 11, except on the surface for the fin 12, so as to surround the lower portion of the fin 12. An insulation film (e.g., SiN film) 14 is selectively formed on the top of the fin 12 to serve as a mask pattern. The insulation film 14 can be removed after it is used as a mask pattern.

A gate electrode section 21 is provided on the insulation film 13 with a gate insulation film 15 interposed therebetween. For example, a SiO film, a HfSiO film, a HfAlO film and a HfO film are used as the gate insulation film 15. The gate electrode section 21 covers a channel section of the fin 12, including the insulation film 14. For example, the gate electrode section 21 is formed in almost the middle of the silicon substrate 11 and in almost perpendicular to the fin 12, as illustrated in FIG. 1A. A gate sidewall insulation film 22 is formed on each of sidewalls of the gate electrode section 21.

In the first embodiment, the gate electrode section 21 is formed by stacking first and second gate electrodes 21a and 21b that are made of their respective first and second electrode materials having different work functions. If a Fin-FET to be formed is of an N conductivity type (first conductivity type, the gate electrode section 21 is formed by stacking a second gate electrode 21b, which is made of a second electrode material having a second work function, on a first gate electrode 21a which is made of a first electrode material having a first work function. The second work function is smaller than the first work function. In contrast, if a Fin-FET to be formed is of a P conductivity type (second conductivity type), the gate electrode section 21 is formed by stacking a second gate electrode 21b, which is made of a second electrode material having a second work function, on a first gate electrode 21a which is made of a first electrode material having a first work function. The second work function is set larger than the first work function such that the threshold value of the second gate electrode 21b becomes larger than that of the first gate electrode 21a.

In both the above N-type Fin-FET and P-type Fin-FET, the threshold value of the first electrode material is larger than that of the second electrode material.

Source and drain diffusion layers 23a and 23b are formed adjacent to the channel section of the fin 12. The source and drain diffusion layers 23a and 23b are formed to leave a body section forming the channel section therebetween by implanting ions (or plasma ions) in a slanting direction. Further, high-concentration source and drain diffusion layers 24a and 24b are formed adjacent to the source and drain diffusion layers 23a and 23b. Furthermore, silicide layers 25a and 25b are formed on the top and side surfaces of the high-concentration source and drain diffusion layers 24a and 24b. These silicide layers 25a and 25b are also formed on the top surface of the gate electrode section 21 when the second gate electrode 21b is polysilicon.

A method of manufacturing the foregoing Fin-FET will be described with reference to FIGS. 2A to 2E through FIGS. 14A to 14E. Assume here that the Fin-FET is of an N conductivity type, the first gate electrode 21a is made of metal (first electrode material) having a first work function ($\Phi$m1=5.0 eV), and the second gate electrode 21b is made of metal (second electrode material) having a second function ($\Phi$m2=4.7 eV) such that the work function of the second gate electrode 21b becomes smaller than that of the first gate electrode 21a. Thus, the threshold value of the first gate electrode 21a is larger than that of the second gate electrode 21b.

Of FIGS. 2A to 2E through FIGS. 14A to 14E, FIGS. 2A, 3A, 4A, 5A, 6A, 7A, 8A, 9A, 10A, 11A, 12A, 13A and 14A are perspective views corresponding to FIG. 1A, FIGS. 2B, 3B, 4B, 5B, 6B, 7B, 8B, 9B, 10B, 11B, 12B, 13B and 14B are plan views corresponding to FIG. 1B, FIGS. 2C, 3C, 4C, 5C, 6C, 7C, 8C, 9C, 10C, 11C, 12C, 13C and 14C are sectional views corresponding to FIG. 1C, FIGS. 2D, 3D, 4D, 5D, 6D, 7D, 8D, 9D, 10D, 11D, 12D, 13D and 14D are sectional views corresponding to FIG. 1D, and FIGS. 2E, 3E, 4E, 5E, 6E, 7E, 8E, 9E, 10E, 11E, 12E, 13E and 14E are sectional views corresponding to FIG. 1E.

Referring first to FIGS. 2A to 2E, a mask pattern (insulation film) 14 for forming an element region as a fin 12 is formed on the top surface of the silicon substrate 11, and a SiN film is also formed thereon by chemical vapor deposition (abbreviated as CVD hereinafter). After that, the SiN film is processed into a desired shape by reactive ion etching (abbreviated as RIE hereinafter) using a resist which is processed into a desired shape by photolithography as a mask. Thus, the mask pattern 14 is formed. The mask pattern 14 serves as an insulation film to prevent a leak between the gate electrode section 21 and the channel section.

Referring then to FIGS. 3A to 3E, the surface area of the silicon substrate 11 is processed by RIE using the mask pattern 14 as a mask to form the fin 12 having a desired height. In general, the amount of driving current in the Fin-FET depends upon the height of the fin 12.

Referring then to FIGS. 4A to 4E, an insulation film 13 for element isolation is formed on the surface area of the silicon substrate 11. For example, a $SiO_2$ film is deposited by CVD and its surface is flattened by chemical mechanical polishing (abbreviated as CMP hereinafter).

Referring then to FIGS. 5A to 5E, the insulation film 13 is thinned. Specifically, the insulation film 13 is thinned by RIE and chemical dry etching (abbreviated as CED hereinafter) such that the height of the exposed fin 12 corresponds to a desired channel width (about 200 nm).

Referring then to FIGS. 6A to 6E, an insulation film 15' such as SiO, HfSiO, HfAlO and HfO, which is to serve as a gate insulation film 15, is deposited on the entire surface of the resultant structure by CVD and physical vapor deposition (abbreviated as PVD hereinafter). A first metal film (first electrode material) 21a' such as a TaN film, a Ru film and a TiAlN film, which has a first work function ($\Phi m1$=5.0 eV), is deposited on the insulation film 15' by CVD and PVD and its surface is flattened by CMP.

Referring then to FIGS. 7A to 7E, the first metal film 21a' is thinned by RIE and CDE and processed to have a desired thickness Tm (about 30 nm) finally.

Referring then to FIGS. 8A to 8E, a second metal film (second electrode material) 21b' such as a HfN film, a NiSi film, a Mo film and a TiN film is deposited on the entire surface of the resultant structure by CVD and PVD and its surface is flattened by CMP. The second metal film 21b' has a second work function ($\Phi m2$=4.7 eV) that is smaller than that of the first gate electrode 21a.

Referring then to FIGS. 9A to 9E, a mask pattern 31 for processing the gate electrode section 21 is formed. For example, a SiN film is deposited on the top surface of the second metal film 21b' by CVD. After that, the SiN film is processed to have a desired shape by RIE using a resist that is processed into a desired shape by photolithography as a mask. Thus, the mask pattern 31 is formed.

Referring then to FIGS. 10A to 10E, the first and second metal films 21a' and 21b' are processed by RIE using the mask pattern 31 as a mask to form a gate electrode section 21 having a two-layer metal film structure. After that, the exposed insulation film 15' is removed by CDE and wet etching to form a gate insulation film 15.

Referring then to FIGS. 11A to 11E, N-type impurities are ion-implanted into the exposed surface of the fin 12 in a slanting direction to form source and drain diffusion layers 23a and 23b. In this case, not the layers 23a and 23b but a channel section (fin 12) having a desired channel length is formed directly under the gate electrode section 21.

Then, an insulation film such as a $SiO_2$ film and a SiN film is deposited on the entire surface of the resultant structure by CVD and processed into a desired shape by RIE. Thus, a gate sidewall insulation film 22 is formed on each of sidewalls of the gate electrode section 21, as illustrated in FIGS. 12A to 12E.

Referring then to FIGS. 13A to 13E, a single-crystal silicon film 33 for increasing the width of the fin 12 is formed selectively by CVD on the outer surface of the fin 12 in which the source and drain diffusion layers 23a and 23b are formed.

Referring then to FIGS. 14A to 14E, N-type impurities are ion-implanted into the single-crystal silicon film 33 to form high-concentration source and drain diffusion layers 24a and 24b.

The insulation film (mask pattern) 31 is separated from the gate electrode section 21 by wet etching and then silicide layers 25a and 25b are formed on the high-concentration source and drain diffusion layers 24a and 24b. The silicide layers 25a and 25b are formed by rapid thermal annealing (abbreviated as RTA hereinafter) while metal materials are deposited on the diffusion layers 24a and 24b by PVD. Thus, the Fin-FET is completed as illustrated in FIGS. 1A to 1E.

After that, an interlayer insulation film is deposited and, for example, a wiring layer for contacting the gate electrode section 21 and the source and drain electrodes is formed. Accordingly, a MIS semiconductor device having a desired fin structure is completed (not shown).

Figures 15, 16:
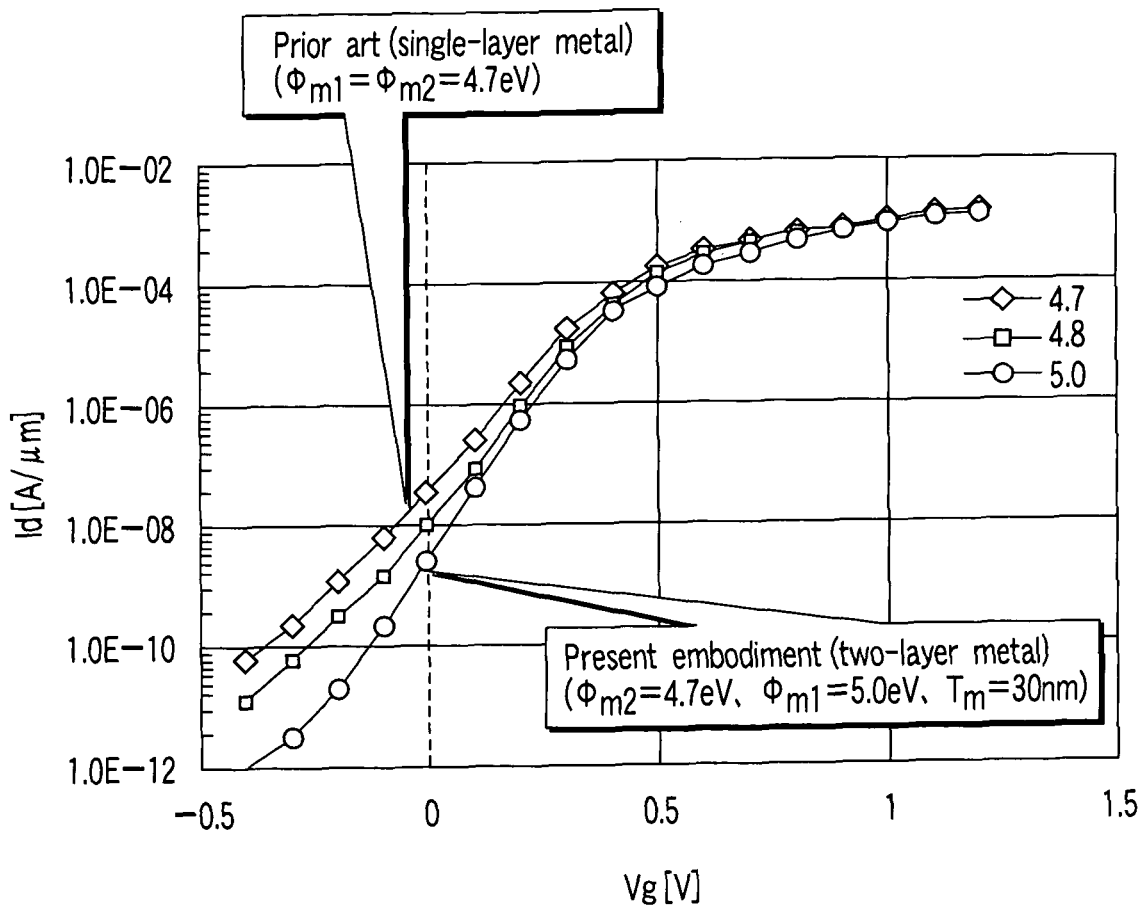
FIG. 15 is a graph of subthreshold characteristics in the Fin-FET according to the first embodiment of the present invention.
FIG. 16 is a table showing a relationship between work functions and metal materials used for gate electrodes in the Fin-FET according to the first embodiment of the present invention.
Figure 20A:
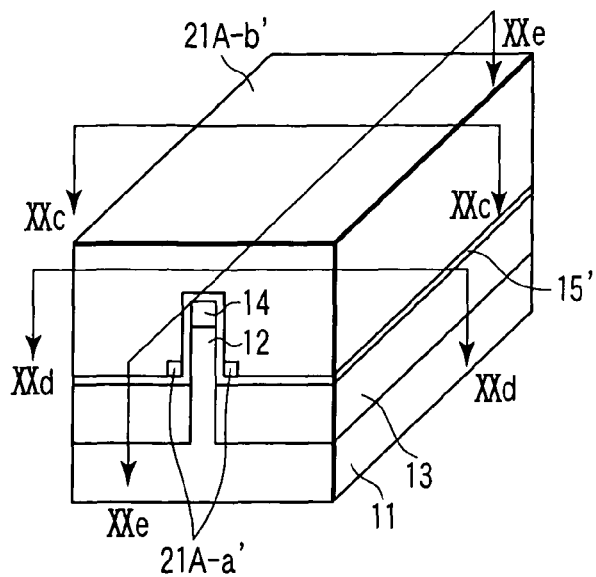
FIGS. 20A to 20E are schematic diagrams illustrating a method of manufacturing the Fin-FET according to the second embodiment of the present invention.
Figure 20B:
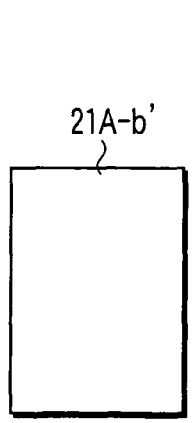
Figure 20C:
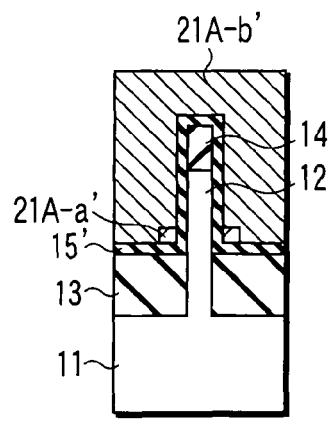
Figure 20D:
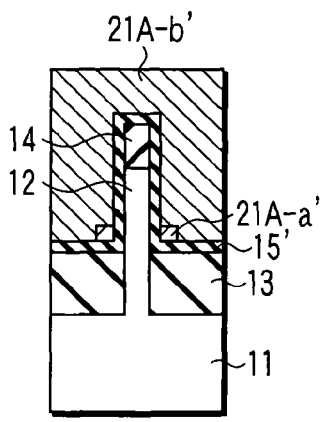
Figure 20E:
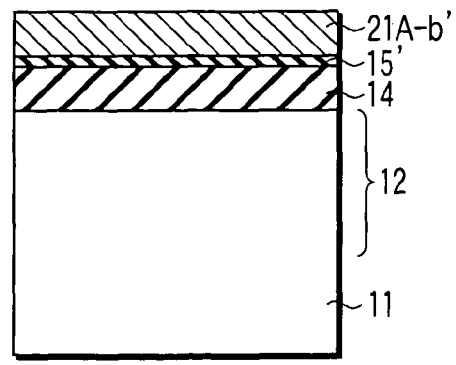

FIG. 15 is a graph of the effects of reducing off-leak currents (subthreshold characteristics) in the Fin-FET described above. The Fin-FET is compared with a prior art Fin-FET in which the gate electrode is formed of a single metal film (work function $\Phi m1$=$\Phi m2$=4.7 eV). In the graph, the horizontal axis indicates a gate voltage (Vg[V]) and the vertical axis indicates a drain current (Id[A/µm]).

As is apparent from the graph shown in FIG. 15, the Fin-FET of the first embodiment in which the gate electrode section 21 is formed of two metal films (work function $\Phi m1$=5.0 eV and work function $\Phi m2$=4.7 eV) allows the off-leak currents or the leak currents generated when gate voltage Vg is 0[V] to be reduced to about one tenth.

As described above, the gate electrode section of the Fin-FET is formed by stacking first and second gate electrodes that are made of first and second electrode materials having different work functions. When the conductivity type of a Fin-FET to be formed is N, the gate electrode section is formed by a first gate electrode that is formed of a first metal film having a first work function and a second gate electrode that is formed of a second metal film having a second work function. The second gate electrode is stacked on the first gate electrode. The threshold value of the second gate electrode is smaller than that of the first gate electrode, or the second work function is smaller than the first work function. When the conductivity type of a Fin-FET to be formed is P, the gate electrode section is formed by a first gate electrode that is formed of a first metal film having a first work function and a second gate electrode that is formed of a second metal film having a second work function. The second gate electrode is stacked on the first gate electrode. The threshold value of the second gate electrode is larger than that of the first gate electrode, or the second work function is larger than the first work function. Thus, the threshold value of the Fin-FET, which decreases due to the short channel effect, can be increased without heightening the impurity concentration of the channel section. Consequently, while the impurity concentration of the channel section is kept low, a punch-through phenomenon caused under the lower portion of the fin can be suppressed and off-leak currents can be reduced. The deterioration of the performance of the Fin-FET, such as the degradation of mobility, an increase in junction leak (junction capacitance) between the source and drain, and variations in threshold value, which is due to the increase of impurity concentration in the channel section can be prevented, and the off-leak currents can be suppressed.

In the foregoing first embodiment, the first and second gate electrodes 21a and 21b that form the gate electrode section 21 are formed of the first metal film 21a' whose work function $\Phi m1$ is 5.0 eV and the second metal film 21b' whose work function $\Phi m2$ is 4.7 eV. As the first and second metal films 21a' and 21b', metal materials that are effective in reducing off-leak currents in the Fin-FET are selected appropriately in accordance with the work functions, as illustrated in FIG. 16.

In FIG. 16, the work functions vary even when the metal materials are the same, which depends on the difference in cited reference documents.

Second Embodiment

FIGS. 17A to 17E show a basic configuration of a semiconductor device (Fin-FET) according to a second embodiment of the present invention. Of these figures, FIG. 17A is a perspective view thereof, FIG. 17B is a plan view thereof, FIG. 17C is a sectional view taken along line XVIIc-XVIIc of FIG. 17A, FIG. 17D is a sectional view taken along line XVIId-XVIId of FIG. 17A, and FIG. 17E is a sectional view taken along line XVIIe-XVIIe of FIG. 17A. The same components as those of the Fin-FET according to the first embodiment (see FIGS. 1A to 1E) are denoted by the same reference numerals and their detailed descriptions are omitted.

As shown in FIGS. 17A to 17E, the Fin-FET according to the second embodiment differs from the Fin-FET according to the first embodiment in that a first gate electrode 21A-a of a gate electrode section 21A is provided to correspond to only part of a second gate electrode 21A-b that is adjacent to at least a fin 12.

A method of manufacturing the foregoing Fin-FET will be described with reference to FIGS. 18A to 18E through FIGS. 20A to 20E. Assume here that the Fin-FET is of an N conductivity type, the first gate electrode 21A-a is made of metal (first electrode material) having a first work function ($\Phi m1=5.0$ eV), and the second gate electrode 21A-b is made of metal (second electrode material) having a second work function ($\Phi m2=4.7$ eV) such that the threshold value of the second gate electrode 21A-b becomes smaller than that of the first gate electrode 21Aa-a, or the work function of the second electrode material becomes smaller than that of the first electrode material. Of FIGS. 18A to 18E through FIGS. 20A to 20E, FIGS. 18A, 19A and 20A are perspective views corresponding to FIG. 17A, FIGS. 18B, 19B and 20B are plan views corresponding to FIG. 17B, FIGS. 18C, 19C and 20C are sectional views corresponding to FIG. 17C, FIGS. 18D, 19D and 20D are sectional views corresponding to FIG. 17D, and FIGS. 18E, 19E and 20E are sectional views corresponding to FIG. 17E.

The second embodiment differs from the first embodiment after the step of partly processing a silicon substrate 11 to form the fin 12 and thinning an insulation film 13 for element isolation (see FIGS. 5A to 5E, for example).

Referring then to FIGS. 18A to 18E, an insulation film 15' such as SiO, HfSiO, HfAlO and HfO, which is to serve as a gate insulation film 15, is deposited on the entire surface of the resultant structure by CVD and PVD. Then, a first metal film (first electrode material) 21A-a' such as a TaN film, a Ru film and a TiAlN film, which has a first work function ($\Phi m1=5.0$ eV), is deposited on the insulation film 15' by CVD and PVD such that its threshold value becomes larger than that of the second gate electrode 21A-b.

Referring then to FIGS. 19A to 19E, the first metal film 21A-a' is processed by RIE to have a desired shape, resulting in a first gate electrode 21A-a that is formed adjacent to at least the fin 12 and corresponds to only part of the second gate electrode 21A-b.

Referring then to FIGS. 20A to 20E, a second metal film (second electrode material) 21A-b' such as a HfN film, a NiSi film, a Mo film and a TiN film, which has a second work function ($\Phi m2=4.7$ eV), is deposited on the entire surface of the resultant structure by CVD and PVD such that its threshold value becomes smaller than that of the first gate electrode 21A-a. Then, the surface of the second metal film 21A-b' is flattened by CMP.

After that, a gate is processed, and source and drain regions, gate sidewalls and salicide are formed as in the first embodiment, thereby completing the Fin-FET shown in FIGS. 17A to 17E.

After that, an interlayer insulation film is deposited and, for example, a wiring layer for contacting the gate electrode section 21A and the source and drain electrodes is formed, thereby achieving a MIS semiconductor device having a desired fin structure (not shown).

Like the Fin-FET of the first embodiment, the Fin-FET of the second embodiment allows a punch-through phenomenon to be suppressed under the lower portion of the fin while keeping the impurity concentration of the channel section low and also allows off-leak currents to reduce.

Third Embodiment

Figure 21A:
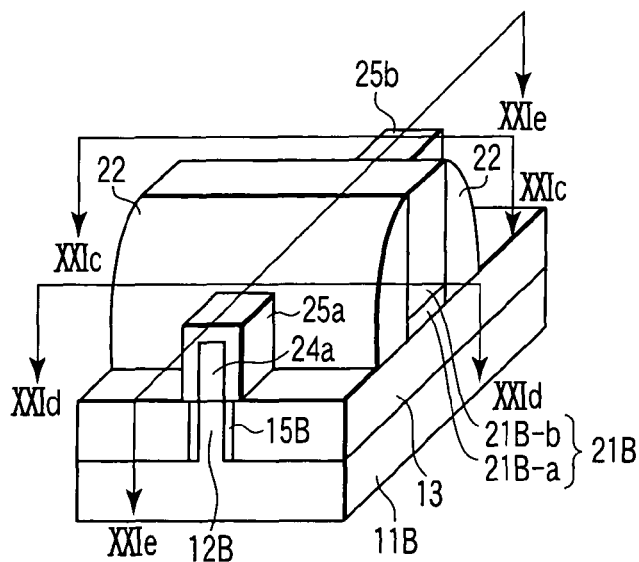
FIGS. 21A to 21E are schematic diagrams showing a configuration of a Fin-FET according to a third embodiment of the present invention.
Figure 21B:
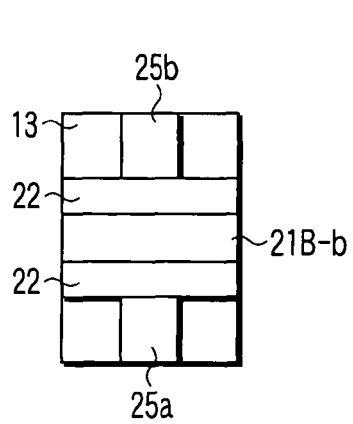
Figure 21C:
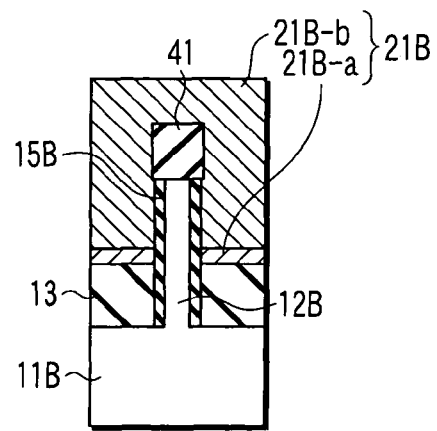
Figure 21D:
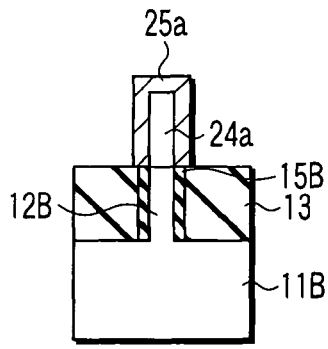
Figure 21E:
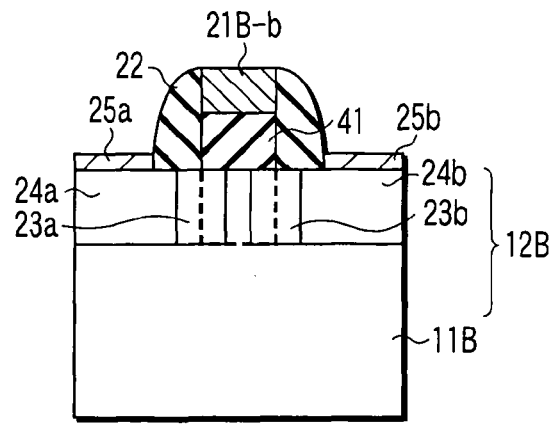
Figure 24A:
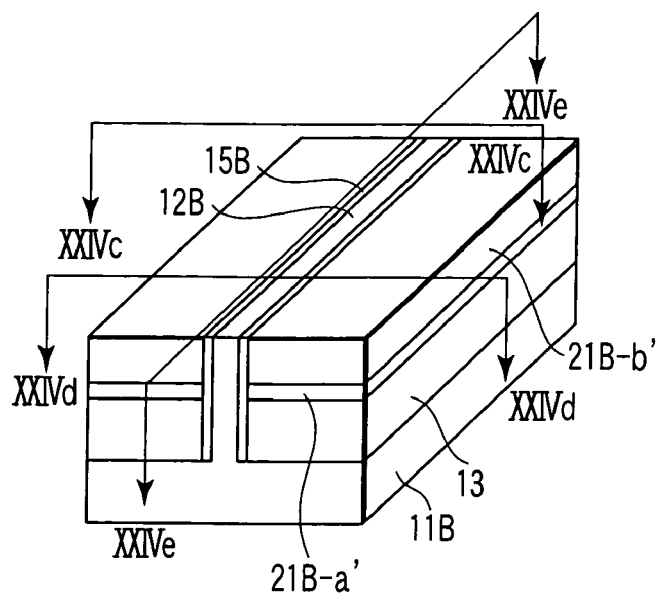
FIGS. 24A to 24E are schematic diagrams illustrating a method of manufacturing the Fin-FET according to the third embodiment of the present invention.
Figures 24B, 24C:
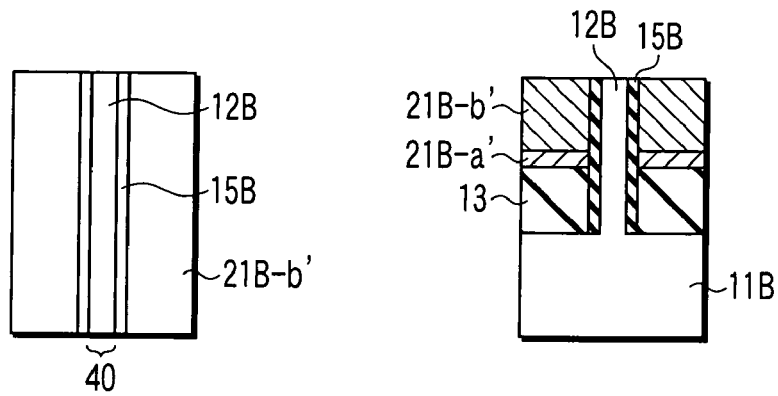
Figures 24D, 24E:
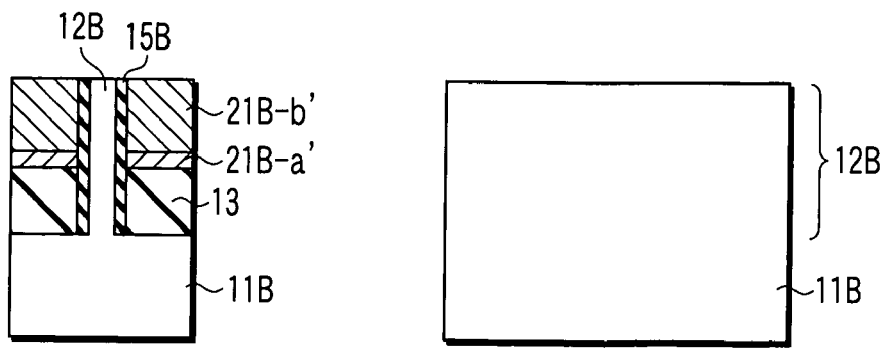
Figure 25A:
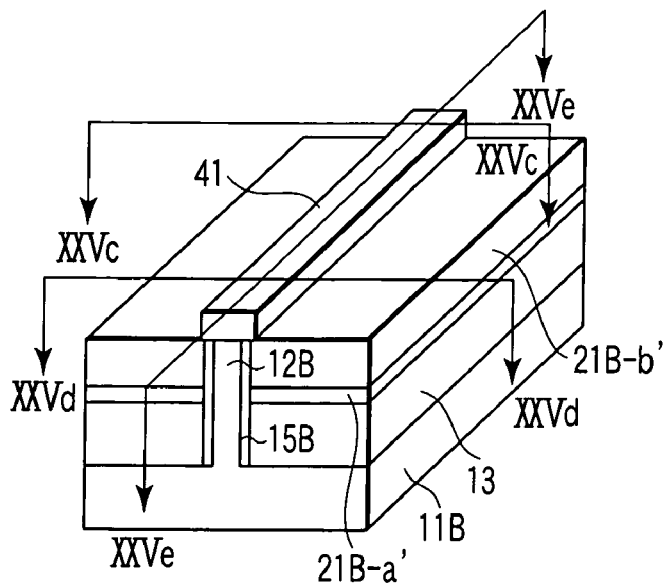
FIGS. 25A to 25E are schematic diagrams illustrating a method of manufacturing the Fin-FET according to the third embodiment of the present invention.
Figure 25B:
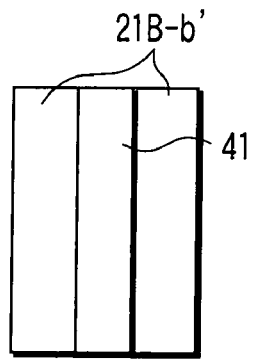
Figure 25C:
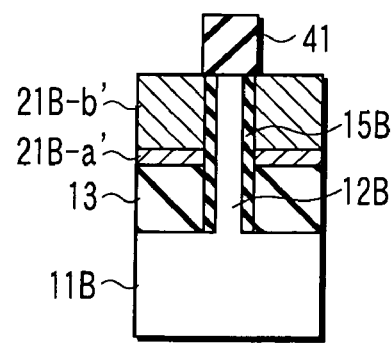
Figure 25D:
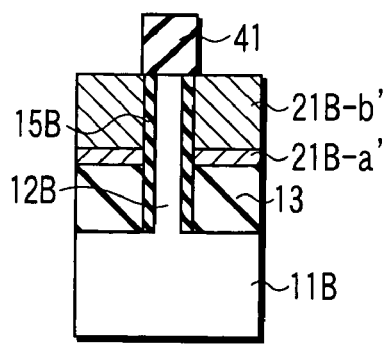
Figure 25E:
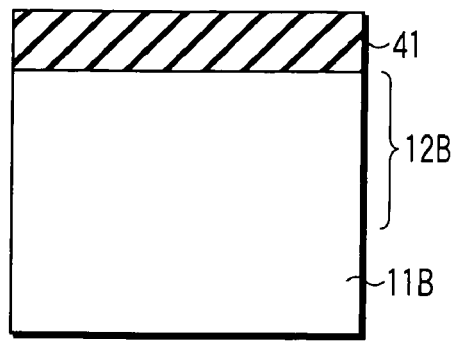

FIGS. 21A to 21E show a basic configuration of a semiconductor device (Fin-FET) according to a third embodiment of the present invention. Of these figures, FIG. 21A is a perspective view thereof, FIG. 21B is a plan view thereof, FIG. 21C is a sectional view taken along line XXIc-XXIc of FIG. 21A, FIG. 21D is a sectional view taken along line XXId-XXId of FIG. 21A, and FIG. 21E is a sectional view taken along line XXIe-XXIe of FIG. 21A. In the third embodiment, a fin is selectively formed on a substrate by selective epitaxial growth. The same components as those of the Fin-FET according to the first embodiment (see FIGS. 1A to 1E) are denoted by the same reference numerals and their detailed descriptions are omitted.

As shown in FIGS. 21A to 21E, the Fin-FET according to the third embodiment differs from the Fin-FET according to the first embodiment in that a fin 12B is selectively formed on the top surface of a silicon substrate 11B by selective epitaxial growth and a gate insulation film 15B is provided along either side of the fin 12B. More specifically, the gate insulation film 15B is provided between the fin 12B and a gate electrode section 21B (including a first gate electrode 21B-a and a second gate electrode 21B-b) and between the fin 12B and an insulation film 13 immediately under the gate electrode section 21B, and it is provided only between the fin 12B and the insulation film 13 except immediately under the gate electrode section 21B.

A method of manufacturing the foregoing Fin-FET will be described with reference to FIGS. 22A to 22E through FIGS. 26A to 26E. Assume here that the Fin-FET is of an N conductivity type, the first gate electrode 21B-a is made of metal (first electrode material) having a first work function ($\Phi m1=5.0$ eV), and the second gate electrode 21B-b is made of metal (second electrode material) having a second function ($\Phi m2=4.7$ eV) such that its threshold value becomes smaller than that of the first gate electrode 21B-a, or the second function is smaller than the first work function of the first electrode material. Of FIGS. 22A to 22E through FIGS. 26A to 26E, FIGS. 22A, 23A, 24A, 25A and 26A are perspective views corresponding to FIG. 21A, FIGS. 22B, 23B, 24B, 25B and 26B are plan views corresponding to FIG. 21B, FIGS. 22C, 23C, 24C, 25C and 26C are sectional views corresponding to FIG. 21C, FIGS. 22D, 23D, 24D, 25D and 26D are sectional views corresponding to FIG. 21D, and FIGS. 22E, 23E, 24E, 25E and 26E are sectional views corresponding to FIG. 21E.

Referring first to FIGS. 22A to 22E, an insulation film 13 for element isolation, a first metal film (first electrode material) 21B-a' that is to serve as a first gate electrode 21B-a, and a second metal film (second electrode material) 21B-b' that is to serve as a second gate electrode 21B-b are deposited in sequence on the top surface of a silicon substrate 11B by CVD and PVD such that each has a desired thickness. In this step, the thickness of the second metal film 21B-b' is controlled in accordance with the height of the fin 12B to be formed. As the first metal film 21B-a', for example, a TaN film, a Ru film and a TiAlN film having a first work function ($\Phi m1=5.0$ eV) are used. As the second metal film 21B-b', for example, a HfN film, a NiSi film, a Mo film and a TiN film having a second work function ($\Phi m2=4.7$ eV), which is smaller than that of the first gate electrode 21B-a, such that their threshold values are each smaller than that of the first gate electrode 21B-a.

After that, in order to form a trench 40, the insulation film 13, first metal film 21B-a' and second metal film 21B-b' are processed by RIE using a mask (not shown) such as a resist.

Referring then to FIGS. 23A to 23E, a gate insulation film 15B is deposited by CVD and PVD to cover the processed insulation film 13, first metal film 21B-al and second metal film 21B-b'.

Referring then to FIGS. 24A to 24E, the gate insulation film 15B is partly removed by RIE to expose the silicon substrate 11B from the bottom of the trench 40. After that, in order to form the fin 12B that is to serve as an element region, single-crystal silicon Si is selectively grown in the trench 40 by, e.g., selective epitaxial growth (SiGe or Ge is grown when the substrate is SiGe or Ge).

Then, for example, a SiN film is deposited on the entire surface of the resultant structure by CVD and then processed into a desired shape by RIE using, e.g., a resist (not shown). Thus, an insulation film 41 is formed to prevent a leak between the gate electrode section 21B and the channel section, as illustrated in FIGS. 25A to 25E.

Referring then to FIGS. 26A to 26E, the second metal film 21B-b' is deposited again by CVD and PVD to cover the insulation film 41 and then its top surface is flattened by CMP.

After that, a gate is processed, and source and drain regions, gate sidewalls and salicide are formed as in the first embodiment, thereby completing the Fin-FET shown in FIGS. 21A to 21E.

After that, an interlayer insulation film is deposited and, for example, a wiring layer for contacting the gate electrode section 21B and the source and drain electrodes is formed, thereby achieving a MIS semiconductor device having a desired fin structure (not shown).

Like the Fin-FET of the first embodiment, the Fin-FET of the third embodiment allows a punch-through phenomenon to be suppressed under the lower portion of the fin while keeping the impurity concentration of the channel section low and also allows off-leak currents to reduce.

Particularly in the third embodiment, the thickness of the first gate electrode 21B-a can be controlled with high precision.

As in the second embodiment, the first gate electrode 21B-a can be provided to correspond to only part of the second gate electrode 21B-b which is adjacent to at least the fin 12B.

In the first to third embodiments described above, the silicon substrate is employed. The present invention is not limited to this. The silicon substrate can be replaced with a SiGe substrate or a Ge substrate.

A P-type Fin-FET as well as the above N-type Fin-FET can easily be obtained. In the P-type Fin-FET, a gate electrode section includes a first gate electrode that is made of a first metal film having a first work function and a second gate electrode that is formed on the first gate electrode and made of a second metal film having a second work function that is larger than that of the first gate electrode.

The gate electrode section can be formed of a polysilicon film as well as a metal film as an electrode material. When the gate electrode section is formed of a polysilicon film, at least one of the first and second gate electrodes can be formed of a polysilicon film or a metallized (full-silicided) polysilicon film. Further, the first gate electrode can be formed of a polysilicon film and the second gate electrode can be formed of a metallized polysilicon film.

The gate electrode sections 21, 21A and 21B each can be formed to have a multilayer structure of three or more layers as well as a two-layer metal structure. For example, a gate electrode section 21C can be formed of a first gate electrode 21a, a third gate electrode 21c stacked thereon, and a second gate electrode 21b stacked thereon, as shown in FIG. 27. When the Fin-FET is of an N conductivity type, its driving current can be increased by setting the work function of the third gate electrode 21c smaller than that of the first gate electrode 21a and larger than that of the second gate electrode 21b, irrespective of whether the third gate electrode 21c is formed intentionally or not. Similarly, when the Fin-FET is of a P conductivity type, its driving current can be increased by setting the work function of the third gate electrode 21c larger than that of the first gate electrode 21a and smaller than that of the second gate electrode 21b, irrespective of whether the third gate electrode 21c is formed intentionally or not.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a fin-shaped semiconductor layer;
   a gate electrode section formed in a widthwise direction of the semiconductor layer with a gate insulation film interposed therebetween, the gate electrode section including a plurality of electrode materials having different work functions and stacked one another, the plurality of electrode materials each being in direct and physical contact with the gate insulation film and the plurality of electrode materials facing a side of the fin-shaped semiconductor;
   a channel section formed adjacent to the gate insulation film in the semiconductor layer; and
   source and drain regions formed adjacent to the channel section.

2. The semiconductor device according to claim 1, wherein said plurality of electrode materials include at least a first gate electrode and a second gate electrode formed on or above the first gate electrode, and the first gate electrode has a threshold value which is larger than that of the second gate electrode.

3. The semiconductor device according to claim 2, wherein the semiconductor device is an N-channel metal oxide semiconductor field effect transistor, and the first gate electrode has a work function which is larger than that of the second gate electrode.

4. The semiconductor device according to claim 2, wherein the semiconductor device is a P-channel metal oxide semiconductor field effect transistor, and the first gate electrode has a work function which is smaller than that of the second gate electrode.

5. The semiconductor device according to claim 2, wherein the gate electrode section includes a third gate electrode between the first gate electrode and the second gate electrode, the third gate electrode having an intermediate work function between a work function of the first gate electrode and a work function of the second gate electrode.

6. The semiconductor device according to claim 1, wherein the semiconductor layer is formed by selectively removing a surface area of a semiconductor substrate.

7. The semiconductor device according to claim 1, wherein the semiconductor layer is selectively formed on a surface of a semiconductor substrate by selective epitaxial growth.

8. The semiconductor device according to claim 2, wherein the second gate electrode is formed of a polysilicon film.

9. The semiconductor device according to claim 2, wherein the first gate electrode is formed of a metal film.

10. The semiconductor device according to claim 2, wherein the second gate electrode is formed of a polysilicon film, and the first gate electrode is formed of a metallized polysilicon film.

11. A semiconductor device comprising:
a semiconductor layer shaped like a fin;
first and second diffusion layers formed on sides of the semiconductor layer, between which a body section is formed; and
a gate electrode section which includes a plurality of electrode materials having different work functions and stacked one another, the plurality of electrode materials in the gate electrode section being provided to be adjacent to the body section with a gate insulation film interposed between the body section and the plurality of electrode materials, the plurality of electrode materials each being in direct and physical contact with the gate insulation film and the plurality of electrode materials facing a side of the body section.

12. The semiconductor device according to claim 11, wherein the semiconductor layer is formed by selectively removing a surface area of a semiconductor substrate.

13. The semiconductor device according to claim 11, wherein the semiconductor layer is selectively formed on a surface of a semiconductor substrate by selective epitaxial growth.

14. The semiconductor device according to claim 11, wherein the gate electrode section includes at least a first gate electrode formed of a first electrode material having a first work function and a second gate electrode formed of a second electrode material having a second work function and stacked above the first gate electrode, and the first gate electrode has a threshold value which is larger than that of the second gate electrode.

15. The semiconductor device according to claim 14, wherein the semiconductor device is an N-channel metal oxide semiconductor field effect transistor, and the first gate electrode has a work function which is larger than that of the second gate electrode.

16. The semiconductor device according to claim 14, wherein the semiconductor device is a P-channel metal oxide semiconductor field effect transistor, and the first gate electrode has a work function which is smaller than that of the second gate electrode.

17. The semiconductor device according to claim 14, wherein the second electrode material is a polysilicon film, and the first electrode material is a metal film.

18. The semiconductor device according to claim 14, wherein the second electrode material is a polysilicon film, and the first electrode material is a metallized polysilicon film.

19. The semiconductor device according to claim 14, wherein the gate electrode section includes a third gate electrode between the first gate electrode and the second gate electrode, and the third gate electrode is formed of a third electrode material having a third work function which is an intermediate work function between the first work function and the second work function.

20. The semiconductor device according to claim 2, wherein an area of the second gate material facing the side of the fin-shaped semiconductor layer is greater than an area of the first gate material facing the side of the fin-shaped semiconductor layer.

21. The semiconductor device according to claim 14, wherein an area of the second gate material facing the side of the body section is greater than an area of the first gate material facing the side of the body section.

* * * * *